(12) United States Patent
Harris et al.

(10) Patent No.: US 11,953,649 B2
(45) Date of Patent: Apr. 9, 2024

(54) FLUID SIMULATOR PROPERTY REPRESENTATION

(71) Applicant: Schlumberger Technology Corporation, Sugar Land, TX (US)

(72) Inventors: Simon Harris, Abingdon (GB); Sheleem Kashem, Kennington (GB); Thomas Viard, Montpellier (FR); Fabrice Levassor, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 726 days.

(21) Appl. No.: 15/733,597

(22) PCT Filed: Apr. 1, 2019

(86) PCT No.: PCT/US2019/025093
§ 371 (c)(1),
(2) Date: Sep. 10, 2020

(87) PCT Pub. No.: WO2019/191746
PCT Pub. Date: Oct. 3, 2019

(65) Prior Publication Data
US 2021/0011191 A1    Jan. 14, 2021

Related U.S. Application Data

(60) Provisional application No. 62/651,151, filed on Mar. 31, 2018.

(51) Int. Cl.
*G01V 99/00*    (2009.01)
*G01V 1/00*    (2006.01)
(Continued)

(52) U.S. Cl.
CPC ............ *G01V 99/005* (2013.01); *G01V 1/003* (2013.01); *G01V 1/282* (2013.01); *G06F 30/20* (2020.01);
(Continued)

(58) Field of Classification Search
CPC ...... G01V 99/005; G01V 1/003; G01V 1/282; G01V 2210/642; G01V 2210/643;
(Continued)

(56) References Cited

U.S. PATENT DOCUMENTS

2012/0265510 A1    10/2012    Lepage
2013/0124161 A1    5/2013    Poudret et al.
(Continued)

OTHER PUBLICATIONS

Levannier, A., et al. "Geological modeling in structurally complex settings using a depositional space and cut-cell unstructured grids." SPE Middle East Oil & Gas Show and Conference. OnePetro, 2017. pp. 1-12. (Year: 2017).*

(Continued)

*Primary Examiner* — John E Johansen
(74) *Attorney, Agent, or Firm* — Julie D. Patel

(57) ABSTRACT

A method can include accessing a depogrid generated via gridding of a structural model in a depositional space and transforming the gridded structural model to a geological space via an inverse mapping where the structural model represents structural features in a subterranean environment based at least in part on data acquired via at least one sensor; determining local u, v and w axes for a plurality of cells in the depogrid via volumetric centroids and vertices represented by coordinates in a depositional space coordinate system (u, v, w) and by coordinates in a physical coordinate system (x, y, z); defining directional geological grid properties based at least in part on the local u, v and w axes; and simulating physical phenomena of the subterranean envi- (Continued)

ronment via a simulator based at least in part on at least a portion of the directional geological grid properties.

20 Claims, 14 Drawing Sheets

(51) Int. Cl.
  *G01V 1/28* (2006.01)
  *G06F 30/20* (2020.01)
  *E21B 49/00* (2006.01)
  *G06F 17/00* (2019.01)

(52) U.S. Cl.
  CPC ........ *E21B 49/00* (2013.01); *G01V 2210/642* (2013.01); *G01V 2210/643* (2013.01); *G01V 2210/66* (2013.01); *G01V 2210/661* (2013.01); *G06F 17/00* (2013.01)

(58) Field of Classification Search
  CPC .......... G01V 2210/66; G01V 2210/661; G06F 30/20; G06F 17/00; E21B 49/00
  USPC ...................................... 703/6, 10
  See application file for complete search history.

(56) References Cited

U.S. PATENT DOCUMENTS

| 2013/0231903 | A1 | 9/2013 | Li et al. |
| 2014/0136171 | A1 | 5/2014 | Sword, Jr. et al. |
| 2015/0153476 | A1* | 6/2015 | Prange .................. E21B 43/00 703/2 |
| 2016/0103246 | A1 | 4/2016 | Freeman et al. |

OTHER PUBLICATIONS

Aavatsmark, I., "An introduction to multipoint flux approximations for quadrilateral grids", Computational Geosciences, 2002, 6, pp. 405-432.
Aavatsmark, I., "Interpretation of a two-point flux stencil for skew parallelogram grids", Computational Geosciences, 2007, 11(3), pp. 199-206.
Benabbou, A. et al., "An Unstructured Depositional Grid for Property Modeling", Petroleum Geostatistics, 2015, Biarritz, France, 2015, 5 pages.
Edwards, M. et al., "Finite volume discretization with imposed flux continuity for the general tensor pressure equation", Computational Geosciences, 1998, 2(4), pp. 259-290.
Ponting, D. K., "Corner Point Geometry in Reservoir Stimulation", Proceedings of Joint IMA/SPE European Conference on the Mathematics of Oil Recovery, Cambridge, United Kingdom, 1989, pp. 45-65.
Search Report and Written Opinion of related International Patent Application No. PCT/US2019/025093 dated Jul. 9, 2019, 7 pages.
International Preliminary Report on Patentability dated Oct. 6, 2020.

* cited by examiner

GRID, EDIT
Sections

PROPS, REGIONS,
SOLUTION Sections

SCHEDULE Section

Method 1210

1220

Calculate Pore Volumes, Transmissibilities, Depths and NNCs.

1240

Initialize, calculate initial saturations, pressures and fluids in place

1260

Define wells and surface facilities. Advance through time by material balance for ind. cells with wells as sinks or sources

FLUID SIMULATOR PROPERTY REPRESENTATION

RELATED APPLICATION

This application claims priority to and the benefit of a U.S. Provisional Application having Ser. No. 62/651,151, filed 31 Mar. 2018, which is incorporated herein by reference.

BACKGROUND

Phenomena associated with a sedimentary basin may be modeled using various equations of a simulator that is a machine, which may be a distributed machine. For application of a numerical technique, such equations may be discretized using a grid that includes nodes, cells, etc. Where a basin includes various types of features (e.g., stratigraphic layers, faults, etc.), nodes, cells, etc., of a grid may represent, or be assigned to, such features. In turn, discretized equations may better represent the basin and its features.

SUMMARY

A method can include accessing a depogrid generated via gridding of a structural model in a depositional space and transforming the gridded structural model to a geological space via an inverse mapping where the structural model represents structural features in a subterranean environment based at least in part on data acquired via at least one sensor; determining local u, v and w axes for a plurality of cells in the depogrid via volumetric centroids and vertices represented by coordinates in a depositional space coordinate system (u, v, w) and by coordinates in a physical coordinate system (x, y, z); defining directional geological grid properties based at least in part on the local u, v and w axes; and simulating physical phenomena of the subterranean environment via a simulator based at least in part on at least a portion of the directional geological grid properties. A system can include a processor; memory operatively coupled to the processor; and processor-executable instructions stored in the memory to instruct the system where the instructions include instructions to: access a depogrid generated via gridding of a structural model in a depositional space and transforming the gridded structural model to a geological space via an inverse mapping where the structural model represents a subterranean environment; determine local u, v and w axes for a plurality of cells in the depogrid via volumetric centroids and vertices represented by coordinates in a depositional space coordinate system (u, v, w) and by coordinates in a physical coordinate system (x, y, z); define directional geological grid properties based at least in part on the local u, v and w axes; and simulate physical phenomena of the subterranean environment via a simulator based at least in part on at least a portion of the directional geological grid properties. One or more computer-readable storage media can include computer-executable instructions to instruct a computer where the instructions include instructions to: access a depogrid generated via gridding of a structural model in a depositional space and transforming the gridded structural model to a geological space via an inverse mapping where the structural model represents a subterranean environment; determine local u, v and w axes for a plurality of cells in the depogrid via volumetric centroids and vertices represented by coordinates in a depositional space coordinate system (u, v, w) and by coordinates in a physical coordinate system (x, y, z); define directional geological grid properties based at least in part on the local u, v and w axes; and simulate physical phenomena of the subterranean environment via a simulator based at least in part on at least a portion of the directional geological grid properties. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
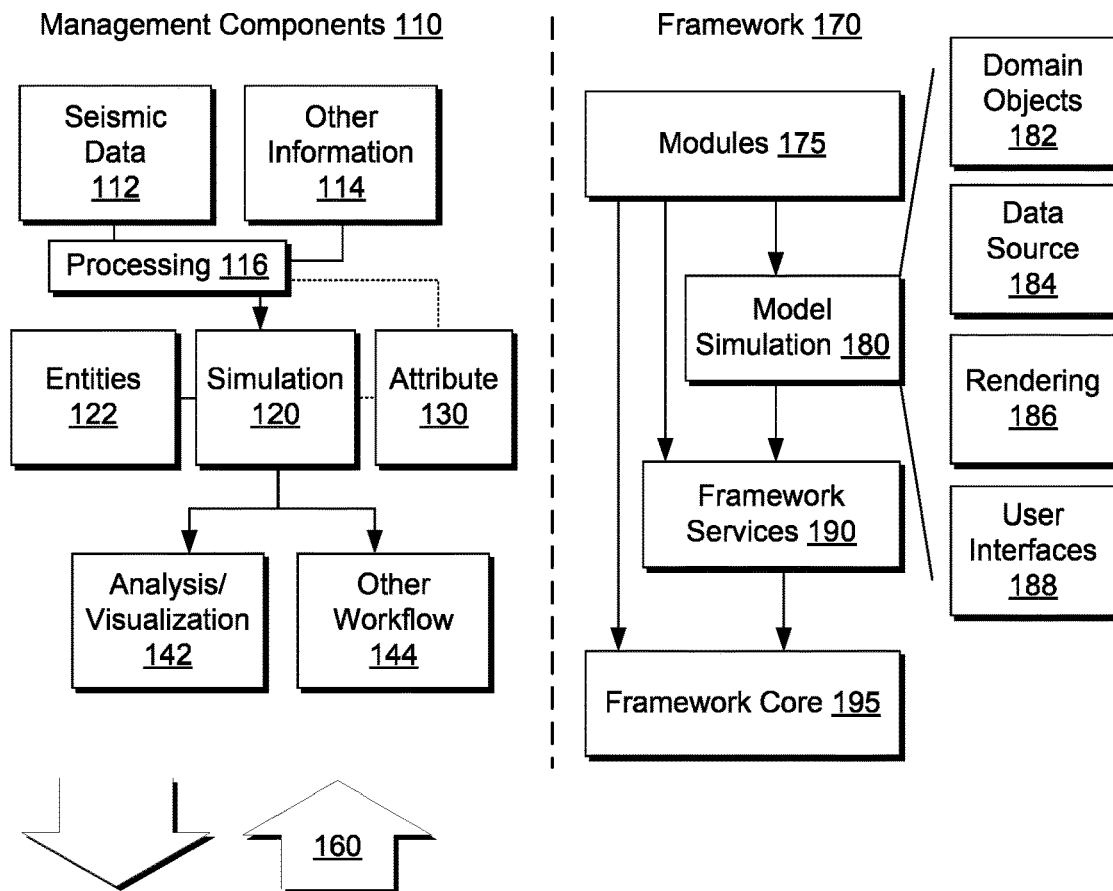
FIG. 1 illustrates an example system that includes various components for modeling a geologic environment and various equipment associated with the geologic environment.
Figure 1:
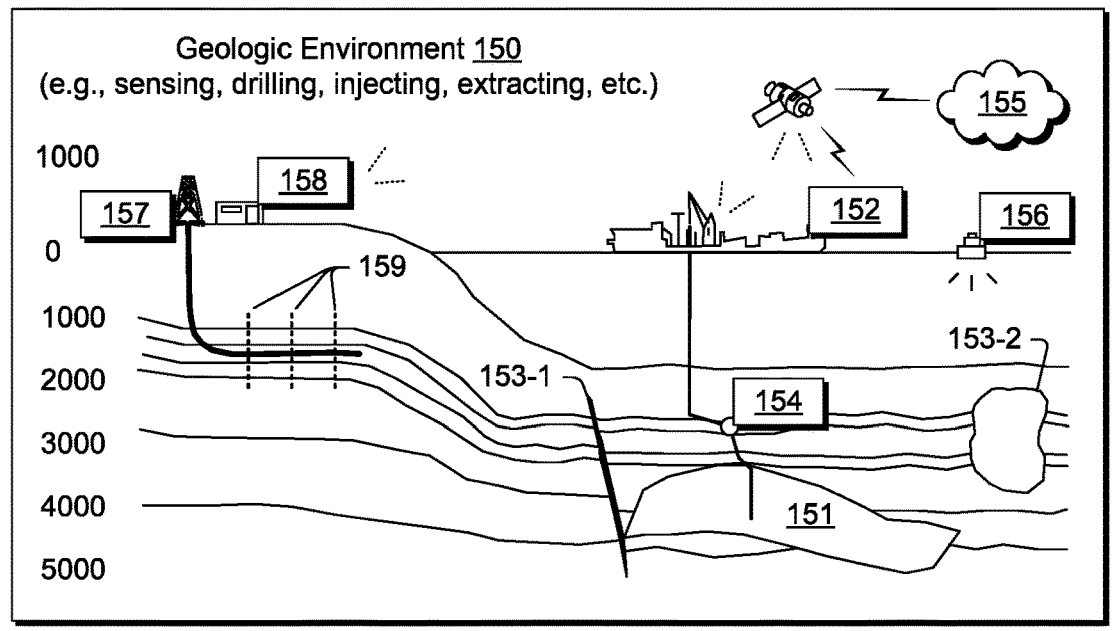

This description is not to be taken in a limiting sense, but rather is made merely for the purpose of describing the general principles of the implementations. The scope of the described implementations should be ascertained with reference to the issued claims.

Phenomena associated with a sedimentary basin (e.g., a subsurface region, whether below a ground surface, water surface, etc.) may be modeled using various equations (e.g., stress, fluid flow, phase, etc.). As an example, a numerical model of a basin may find use for understanding various processes related to exploration and production of natural resources (estimating reserves in place, drilling wells, forecasting production, etc.).

For application of a numerical technique, equations may be discretized using a grid that includes nodes, cells, etc. For example, a numerical technique such as the finite difference method can include discretizing a 1D differential heat equation for temperature with respect to a spatial coordinate to approximate temperature derivatives (e.g., first order, second order, etc.). Where time is of interest, a derivative of temperature with respect to time may also be provided. As to the spatial coordinate, the numerical technique may rely on a spatial grid that includes various nodes where a temperature will be provided for each node upon solving the heat equation (e.g., subject to boundary conditions, generation terms, etc.). Such an example may apply to multiple dimensions in space (e.g., where discretization is applied to the multiple dimensions). Thus, a grid may discretize a volume of interest (VOI) into elementary elements (e.g., cells or grid blocks) that may be assigned or associated with properties (e.g. porosity, rock type, etc.), which may be germane to simulation of physical processes (e.g., fluid flow, reservoir compaction, etc.).

As another example of a numerical technique, consider the finite element method where space may be represented by one dimensional or multidimensional "elements". For one spatial dimension, an element may be represented by two nodes positioned along a spatial coordinate. For multiple spatial dimensions, an element may include any number of nodes. Further, some equations may be represented by the total number nodes while others are represented by fewer than the total number of nodes (e.g., consider an example for the Navier-Stokes equations where fewer than the total number of nodes represent pressure). The finite element method may include providing nodes that can define triangular elements (e.g., tetrahedra in 3D, higher order simplexes in multidimensional spaces, etc.) or quadrilateral elements (e.g., hexahedra or pyramids in 3D, etc.), or polygonal elements (e.g., prisms in 3D, etc.). Such elements, as defined by corresponding nodes of a grid, may be referred to as grid cells.

Yet another example of a numerical technique is the finite volume method. For the finite volume method, values for model equation variables may be calculated at discrete places on a grid, for example, a node of the grid that includes a "finite volume" surrounding it. The finite volume method may apply the divergence theorem for evaluation of fluxes at surfaces of each finite volume such that flux entering a given finite volume equals that leaving to one or more adjacent finite volumes (e.g., to adhere to conservation laws). For the finite volume method, nodes of a grid may define grid cells.

As an example, a finite volume flow simulator may simulate phenomena using a grid where grid cells defined by the grid may include 6 faces (e.g., cuboid) addressable through three indices (e.g., such that the grid may be deemed a "structured" grid) and that geometry of the grid abides by one or more conditions (e.g., cells do not cross geologic faults and cells do not cross geologic horizons). As an example, in an effort to meet a geologic fault condition, a grid may be offset across one or more geologic faults. Construction of such a grid in a domain where topology of a fault network is complex (e.g., numerous X and Y-shaped intersections) may be non-trivial and demand resources that scale nonlinearly with increasing fault network complexity.

As an example, an approach to modeling of a sedimentary basin can include a pillar grid composed of nodes, pillars and cells. For example, in three-dimensions, eight nodes may define a cell, which may be referred to as a grid cell (e.g., a pillar grid cell). In a pillar grid model, grid cells may be indexed in an indexical domain using indexes i, j, and k (e.g., an indexical coordinate system or space, which may be represented as I, J, and K or other characters, symbols, etc.). For example, a cubic grid cell (i.e., defined by eight corner nodes) may be indexed at its shallowest lower left corner and the number of grid cells may be a product of the model's i, j and k dimensions. In such an example, each grid cell may be defined by its eight nodes, which may be labeled according to height and compass directions (e.g., basesouthwest, topsouthwest, basenorthwest, topnorthwest, etc.). Pillar grids can model, for example, faults (e.g., a surface that cuts a pillar grid), horizons (e.g., "k" index), zones (e.g., volume between two horizons), segments (e.g., contiguous block of grid cells bounded by fault planes), etc., and may be used to specify properties (e.g., earth properties).

While an indexical coordinate system is described with respect to a pillar grid, an indexical coordinate system may be used in conjunction with other types of grids. For example, a grid that can define cells may be characterized using indexes such as i, j, and k to represent three spatial dimensions. Such indexes may be capable of representing a grid, for example, in a so-called structured manner (e.g., in contrast to an unstructured manner). As an example, a structured grid may facilitate various types of operations such as those related to matrices, for example, where nearest neighbors may form clusters or bands within a matrix. In turn, a matrix may be handled using a banded solver or other suitable technique. As to a solver for an unstructured grid, as an example, it may rely on input of connectivity information that specifies how grid nodes relate to individual cells. In such an example, a matrix that may not be readily amenable to a banded or other matrix handling technique, which, in turn, can increase computational resource demands, computation time, etc.

As an example, a structured grid that includes a natural (i, j, k) indexing system can improve storage and, for example, facilitate identification of topological neighbors where cell index and connectivity might not be stored in memory and can be deduced from ordering of records/entries in memory. In such an example, storing a structured grid can use less memory than, for example, storing an unstructured grid of similar size. Further, as an example, for construction of large systems of equations (e.g., independently from their resolution), which may involve repeatedly iterating over topological neighbors of a given grid cell, such an approach may be, for example, about an order of magnitude faster when compared to use of an unstructured grid. As an example, a method that can generate a structured grid may provide compatibility with one or more frameworks (e.g., whether current, legacy, etc.).

As mentioned, where a sedimentary basin (e.g., subsurface region) includes various types of features (e.g., stratigraphic layers, faults, etc.), nodes, cells, etc. of a grid may represent, or be assigned to, such features. In turn, discretized equations may better represent the sedimentary basin and its features. As an example, a structured grid that can represent a sedimentary basin and its features, when compared to an unstructured grid, may allow for more simulations runs, more model complexity, less computational resource demands, less computation time, etc.

As an example, a grid may conform to structural features such as, for example, Y-faults, X-faults, low-angle unconformities, salt bodies, intrusions, etc. (e.g., geological discontinuities), to more fully capture complexity of a geological model. As an example, a grid may optionally conform to stratigraphy (e.g., in addition to one or more geological discontinuities). As to geological discontinuities, these may include model discontinuities such as one or more model boundaries. As an example, a grid may be populated with property fields generated, for example, by geostatistical methods.

As an example, a discontinuity may be discerned via seismology (e.g., seismic imaging) where, for example, a subsurface boundary or interface exists at which a physical quantity, such as the velocity of transmission of seismic waves, changes abruptly. For example, the velocity of P-waves increases from about 6.5 km/s to about 8 km/s at the Mohorovicic discontinuity between the Earth's crust and mantle.

Seismic interpretation is a process that involves examining seismic data (e.g., with respect to location and time or depth) to identify one or more types of subsurface structures (e.g., horizons, faults, geobodies, etc.). An interpretation process may consider vertical seismic sections, inline and crossline directions, horizontal seismic sections called horizontal time slices, etc. Seismic data may optionally be interpreted with other data such as, for example, well log data.

As an example, seismic interpretation may be performed using seismic to simulation software such as the PETREL seismic to simulation software framework (Schlumberger Limited, Houston, Texas), which includes various features, for example, to perform attribute analyses (e.g., with respect to a 3D seismic cube, a 2D seismic line, etc.), to analyze other data, to build models, etc. While the PETREL seismic to simulation software framework is mentioned, other types of software, frameworks, etc., may be employed.

FIG. 1 shows an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. An example of an object-based framework is the MICROSOFT .NET™ framework (Redmond, Washington), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE reservoir simulator (Schlumberger Limited, Houston Texas), the INTERSECT reservoir simulator (Schlumberger Limited, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a framework such as the PETREL seismic to simulation software framework (Schlumberger Limited, Houston, Texas). The PETREL framework provides components that allow for optimization of exploration and development operations. The PETREL framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a framework environment such as the OCEAN framework environment (Schlumberger Limited, Houston, Texas) allows for integration of add-ons (or plug-ins) into a PETREL framework workflow. The OCEAN framework environment leverages .NET tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the OCEAN framework where the model simulation layer 180 is the PETREL model-centric software package that hosts OCEAN framework applications. In an example embodiment, the PETREL software may be considered a data-driven application. The PETREL software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL software, for example, that operates on seismic data, seismic attribute(s), etc. As an example, a workflow may be a process implementable in the OCEAN framework. As an example, a workflow may include one or more worksteps that access a set of instructions such as a plug-in (e.g., external executable code, etc.).

Figure 2:
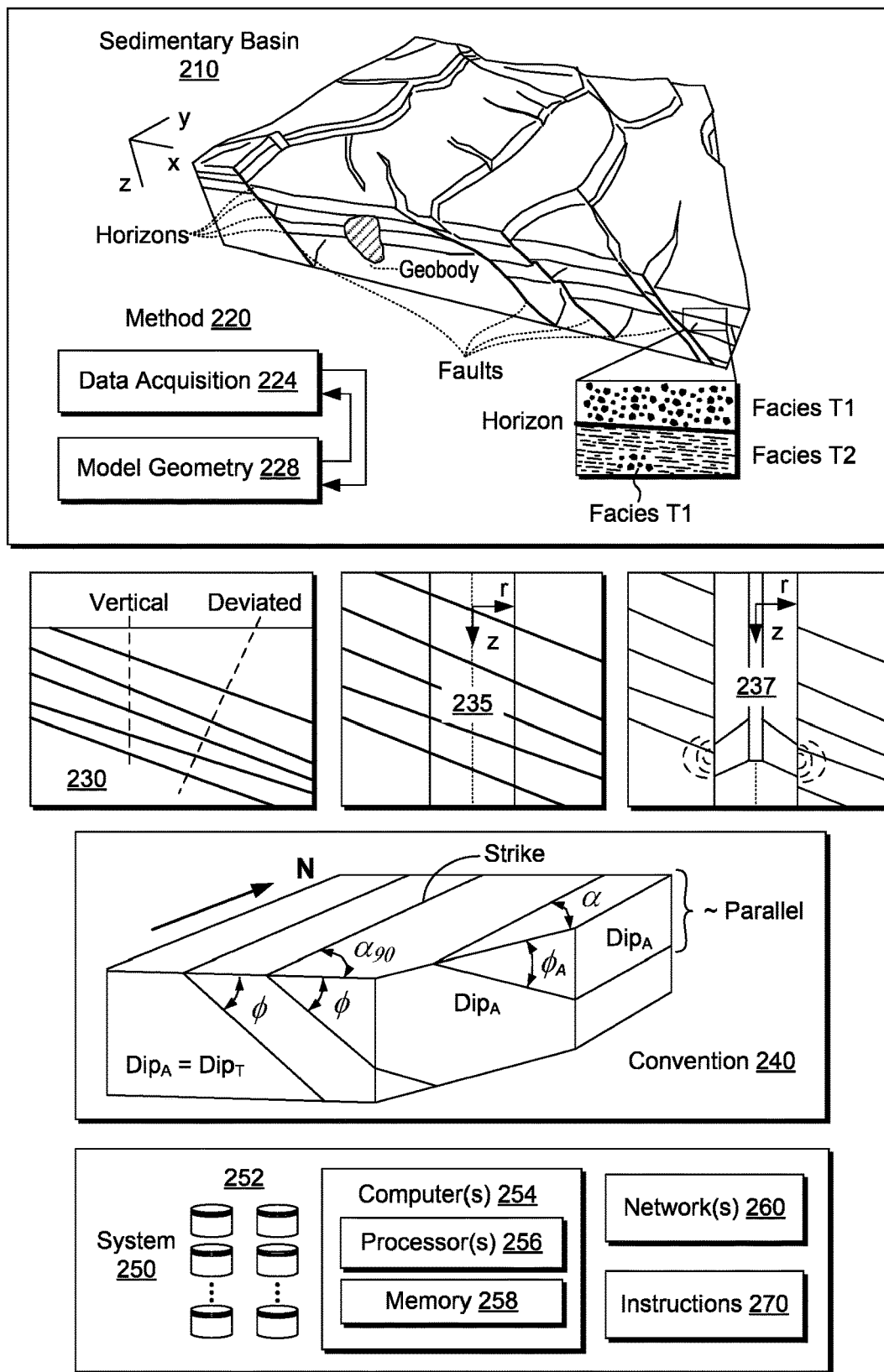
FIG. 2 illustrates an example of a sedimentary basin, an example of a method, an example of a formation, an example of a borehole, an example of a borehole tool, an example of a convention and an example of a system.

FIG. 2 shows an example of a sedimentary basin 210 (e.g., a geologic environment), an example of a method 220 for model building (e.g., for a simulator, etc.), an example of a formation 230, an example of a borehole 235 in a formation, an example of a convention 240 and an example of a system 250.

As an example, reservoir simulation, petroleum systems modeling, etc. may be applied to characterize various types of subsurface environments, including environments such as those of FIG. 1.

In FIG. 2, the sedimentary basin 210, which is a geologic environment, includes horizons, faults, one or more geobodies and facies formed over some period of geologic time. These features are distributed in two or three dimensions in space, for example, with respect to a Cartesian coordinate system (e.g., x, y and z) or other coordinate system (e.g., cylindrical, spherical, etc.). As shown, the model building method 220 includes a data acquisition block 224 and a model geometry block 228. Some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Furthermore, data may include depth and thickness maps stemming from facies variations (e.g., due to seismic unconformities) assumed to following geological events ("iso" times) and data may include lateral facies variations (e.g., due to lateral variation in sedimentation characteristics).

To proceed to modeling of geological processes, data may be provided, for example, data such as geochemical data (e.g., temperature, kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling, quantities such as temperature, pressure and porosity distributions within the sediments may be modeled, for example, by solving partial differential equations (PDEs) using one or more numerical techniques. Modeling may also model geometry with respect to time, for example, to account for changes stemming from geological events (e.g., deposition of material, erosion of material, shifting of material, etc.).

A modeling framework such as the PETROMOD framework (Schlumberger Limited, Houston, Texas) includes features for input of various types of information (e.g., seismic, well, geological, etc.) to model evolution of a sedimentary basin. The PETROMOD framework provides for petroleum systems modeling via input of various data such as seismic data, well data and other geological data, for example, to model evolution of a sedimentary basin. The PETROMOD framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL framework, workflows may be constructed to provide basin-to-prospect scale exploration solutions. Data exchange between frameworks can facilitate construction of models, analysis of data (e.g., PETROMOD framework data analyzed using PETREL framework capabilities), and coupling of workflows.

As shown in FIG. 2, the formation 230 includes a horizontal surface and various subsurface layers. As an example, a borehole may be vertical. As another example, a borehole may be deviated. In the example of FIG. 2, the borehole 235 may be considered a vertical borehole, for example, where the z-axis extends downwardly normal to the horizontal surface of the formation 230. As an example, a tool 237 may be positioned in a borehole, for example, to acquire information. As mentioned, a borehole tool may be configured to acquire electrical borehole images. As an example, the fullbore Formation MicroImager (FMI) tool (Schlumberger Limited, Houston, Texas) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

As an example, a borehole may be vertical, deviate and/or horizontal. As an example, a tool may be positioned to acquire information in a horizontal portion of a borehole. Analysis of such information may reveal vugs, dissolution planes (e.g., dissolution along bedding planes), stress-related features, dip events, etc. As an example, a tool may acquire information that may help to characterize a fractured reservoir, optionally where fractures may be natural and/or artificial (e.g., hydraulic fractures). Such information may assist with completions, stimulation treatment, etc. As an example, information acquired by a tool may be analyzed using a framework such as the TECHLOG framework (Schlumberger Limited, Houston, Texas).

As to the convention 240 for dip, as shown, the three dimensional orientation of a plane can be defined by its dip and strike. Dip is the angle of slope of a plane from a horizontal plane (e.g., an imaginary plane) measured in a vertical plane in a specific direction. Dip may be defined by magnitude (e.g., also known as angle or amount) and azimuth (e.g., also known as direction). As shown in the convention 240 of FIG. 2, various angles $\phi$ indicate angle of slope downwards, for example, from an imaginary horizontal plane (e.g., flat upper surface); whereas, dip refers to the direction towards which a dipping plane slopes (e.g., which may be given with respect to degrees, compass directions, etc.). Another feature shown in the convention of FIG. 2 is strike, which is the orientation of the line created by the intersection of a dipping plane and a horizontal plane (e.g., consider the flat upper surface as being an imaginary horizontal plane).

Some additional terms related to dip and strike may apply to an analysis, for example, depending on circumstances, orientation of collected data, etc. One term is "true dip" (see, e.g., $Dip_T$ in the convention 240 of FIG. 2). True dip is the dip of a plane measured directly perpendicular to strike (see, e.g., line directed northwardly and labeled "strike" and angle $\alpha_{90}$) and also the maximum possible value of dip magnitude. Another term is "apparent dip" (see, e.g., $Dip_A$ in the convention 240 of FIG. 2). Apparent dip may be the dip of a plane as measured in any other direction except in the direction of true dip (see, e.g., $\phi_A$ as $Dip_A$ for angle $\alpha$); however, it is possible that the apparent dip is equal to the true dip (see, e.g., $\phi$ as $Dip_A = Dip_T$ for angle $\alpha_{90}$ with respect to the strike). In other words, where the term apparent dip is used (e.g., in a method, analysis, algorithm, etc.), for a particular dipping plane, a value for "apparent dip" may be equivalent to the true dip of that particular dipping plane.

As shown in the convention 240 of FIG. 2, the dip of a plane as seen in a cross-section perpendicular to the strike is true dip (see, e.g., the surface with $\phi$ as $Dip_A = Dip_T$ for angle $\alpha_{90}$ with respect to the strike). As indicated, dip observed in a cross-section in any other direction is apparent dip (see, e.g., surfaces labeled $Dip_A$). Further, as shown in the convention 240 of FIG. 2, apparent dip may be approximately 0 degrees (e.g., parallel to a horizontal surface where an edge of a cutting plane runs along a strike direction).

In terms of observing dip in wellbores, true dip is observed in wells drilled vertically. In wells drilled in any other orientation (or deviation), the dips observed are apparent dips (e.g., which are referred to by some as relative dips). In order to determine true dip values for planes observed in such boreholes, as an example, a vector computation (e.g., based on the borehole deviation) may be applied to one or more apparent dip values.

As mentioned, another term that finds use in sedimentological interpretations from borehole images is "relative dip" (e.g., $Dip_R$). A value of true dip measured from borehole images in rocks deposited in very calm environments may be subtracted (e.g., using vector-subtraction) from dips in a sand body. In such an example, the resulting dips are called relative dips and may find use in interpreting sand body orientation.

A convention such as the convention 240 may be used with respect to an analysis, an interpretation, an attribute, etc. (see, e.g., various blocks of the system 100 of FIG. 1). As an example, various types of features may be described, in part, by dip (e.g., sedimentary bedding, faults and fractures, cuestas, igneous dikes and sills, metamorphic foliation, etc.). As an example, dip may change spatially as a layer approaches a geobody. For example, consider a salt body that may rise due to various forces (e.g., buoyancy, etc.). In such an example, dip may trend upward as a salt body moves upward.

Seismic interpretation may aim to identify and/or classify one or more subsurface boundaries based at least in part on one or more dip parameters (e.g., angle or magnitude, azimuth, etc.). As an example, various types of features (e.g., sedimentary bedding, faults and fractures, cuestas, igneous dikes and sills, metamorphic foliation, etc.) may be described at least in part by angle, at least in part by azimuth, etc.

As an example, equations may be provided for petroleum expulsion and migration, which may be modeled and simulated, for example, with respect to a period of time. Petroleum migration from a source material (e.g., primary migration or expulsion) may include use of a saturation model where migration-saturation values control expulsion. Determinations as to secondary migration of petroleum (e.g., oil or gas), may include using hydrodynamic potential of fluid and accounting for driving forces that promote fluid flow. Such forces can include buoyancy gradient, pore pressure gradient, and capillary pressure gradient.

As shown in FIG. 2, the system 250 includes one or more information storage devices 252, one or more computers 254, one or more networks 260 and one or more sets of instructions 270. As to the one or more computers 254, each computer may include one or more processors (e.g., or processing cores) 256 and memory 258 for storing instructions, for example, executable by at least one of the one or more processors. As an example, a computer may include one or more network interfaces (e.g., wired or wireless), one or more graphics cards, a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 252.

As an example, the one or more sets of instructions 270 may include instructions (e.g., stored in memory) executable by one or more processors to instruct the system 250 to perform various actions. As an example, the system 250 may be configured such that the one or more sets of instructions 270 provide for establishing the framework 170 of FIG. 1 or a portion thereof. As an example, one or more methods, techniques, etc. may be performed using one or more sets of instructions, which may be, for example, one or more of the one or more sets of instructions 270 of FIG. 2.

Figure 3:
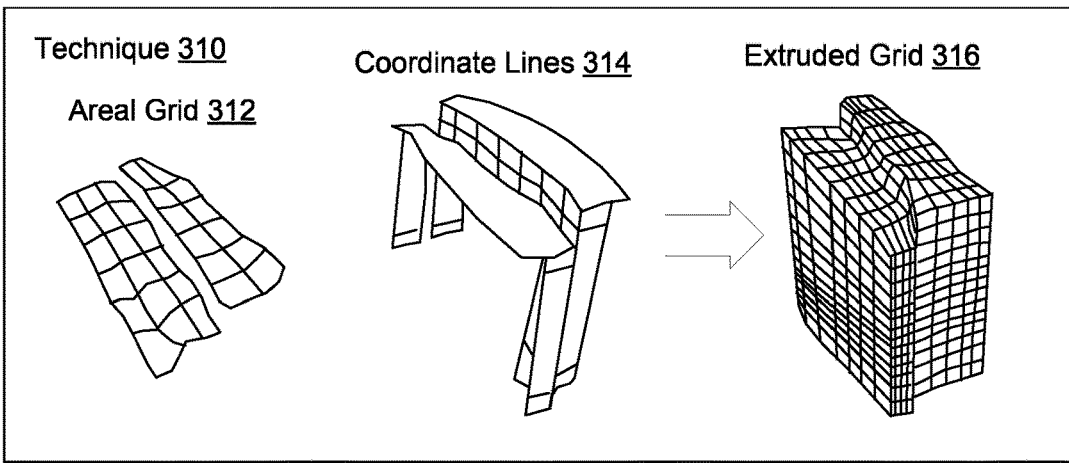
FIG. 3 illustrates examples of techniques, an example of a stairstepped grid and an example of a stairstepped representation of a fault.
Figure 3:
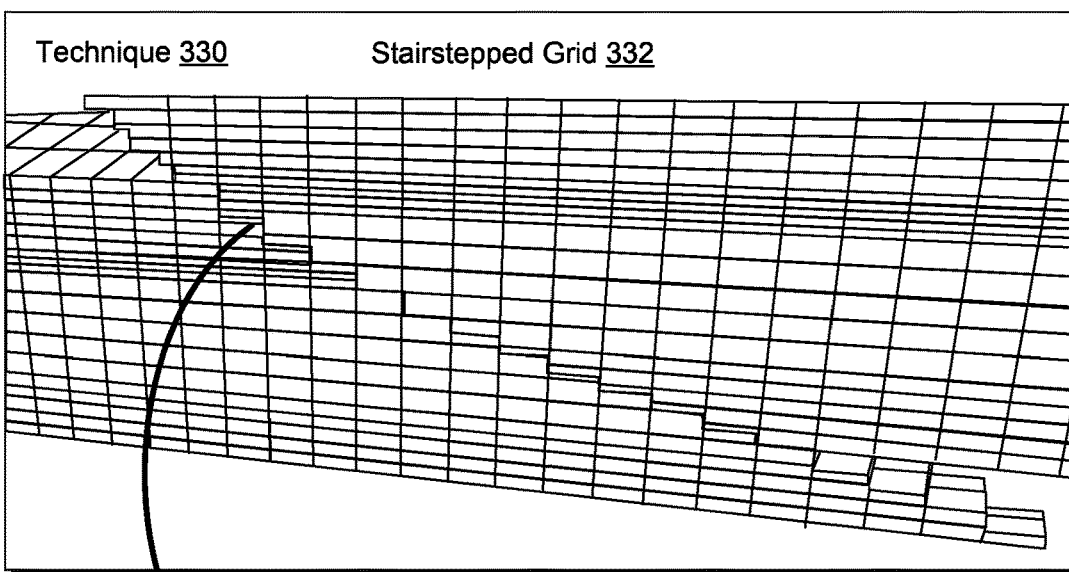
Figure 3:
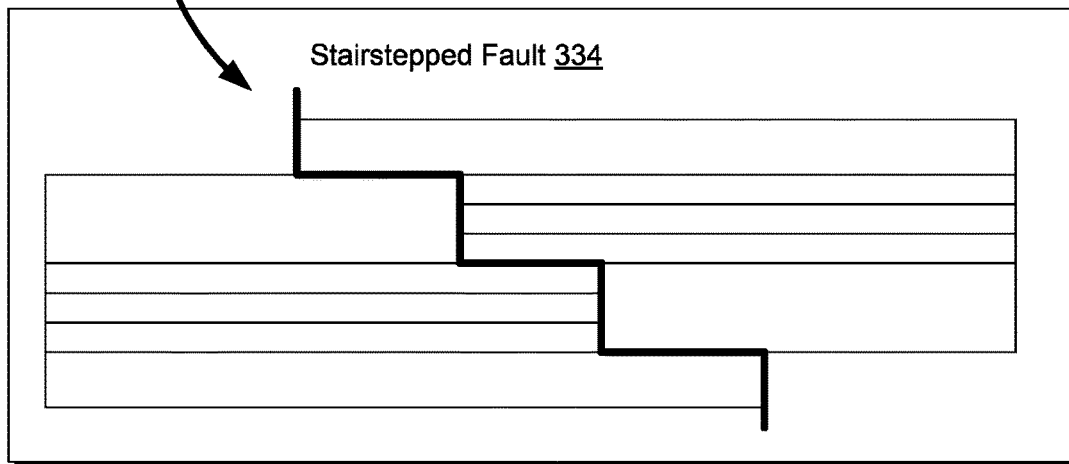

FIG. 3 shows examples of techniques for handling faults. In particular, a technique 310 and/or a technique 330 can be used for creating faulted structured grids that aim to conform to geological horizons.

As to the technique 310, it is based on the extrusion of a surface grid. For example, a topological areal grid 312 conforming to and cut by a fault of a fault network is built and some coordinate lines 314 are provided. Given the grid 312 and the coordinate lines 314, a 3D grid 316 is created by an extrusion process that may include duplicating multiple times the base grid and adapting it to the horizon geometry, along linear or curved coordinate lines which trajectory is computed in such a way it does not cross the fault network.

The technique 310 can give rise to some issues, for example, it may not be possible to design coordinate lines that run from the base to the top of the grid without crossing any fault and it may not allow efficient minimization of distortion of grid cells (e.g., distortion being defined as a measure of the distance to purely orthogonal geometries).

As to the technique 330, it includes creating first a 3D (e.g., unfaulted) grid that conforms to horizon surfaces and then, for example, rasterizing faults within the grid. In such an example, the action of rasterizing can corresponds to finding the set of cell facets that correspond the best to the fault surfaces and "unsewing" (e.g., unstitching) the grid along these facets. Such a rasterization process involves computing a set of edges of a topological dual of the grid that are intersected by an object(s) to be rasterized, which, in the example of FIG. 3, is a fault, as shown in a side view of a 3D grid 332 and in an enlarged simplified side view 334.

The technique 330 can give rise to some issues. For example, the grid facets representing the faults may poorly approximate the geometry of the initial fault surfaces. And, such a rasterization operation may involve creating a stairstepped (or zig-zag) representation of the fault surfaces (see, e.g., 334). Consequences of stairstepped geometry may be germane to petrophysical properties—potentially affecting flow simulations—as may be associated with fault surfaces (e.g., such as those related to fault permeability) and to situations where wells are crossing faults because location of the intersections with the faults are represented with some level of inaccuracy.

Rasterization, as applied to a grid, may subject grid geometry to one or more constraints. For example, consider a desire to maintain matching stairsteps on both sides of a fault (e.g., to avoid gaps, overlaps, etc.) and another desire to maintain layering of a grid that follows geological surfaces (e.g., per seismic or well data). As fault displacement may create an offset between both sides of the fault that does not correspond to an integer number of cells in a vertical direction of a grid (e.g., k index, time, or depth), distortions may occur in the neighborhood of a fault (e.g., by stretching, squeezing or merging grid cells vertically, moving horizons artificially, or both).

Figure 4:
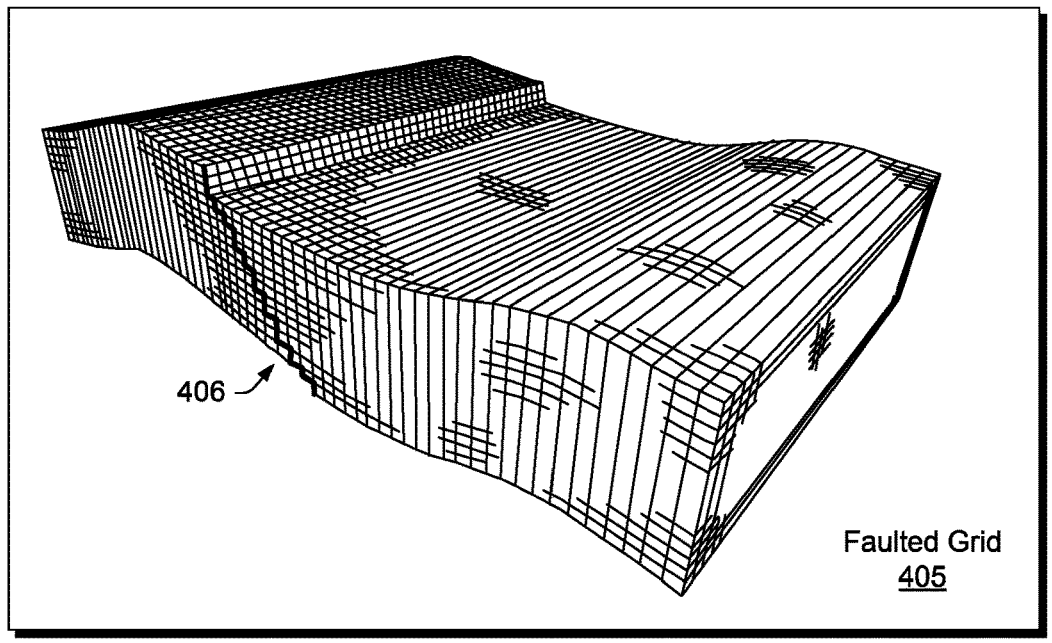
FIG. 4 illustrates an example of a geologic model and an example of a portion of the model.
Figure 4:
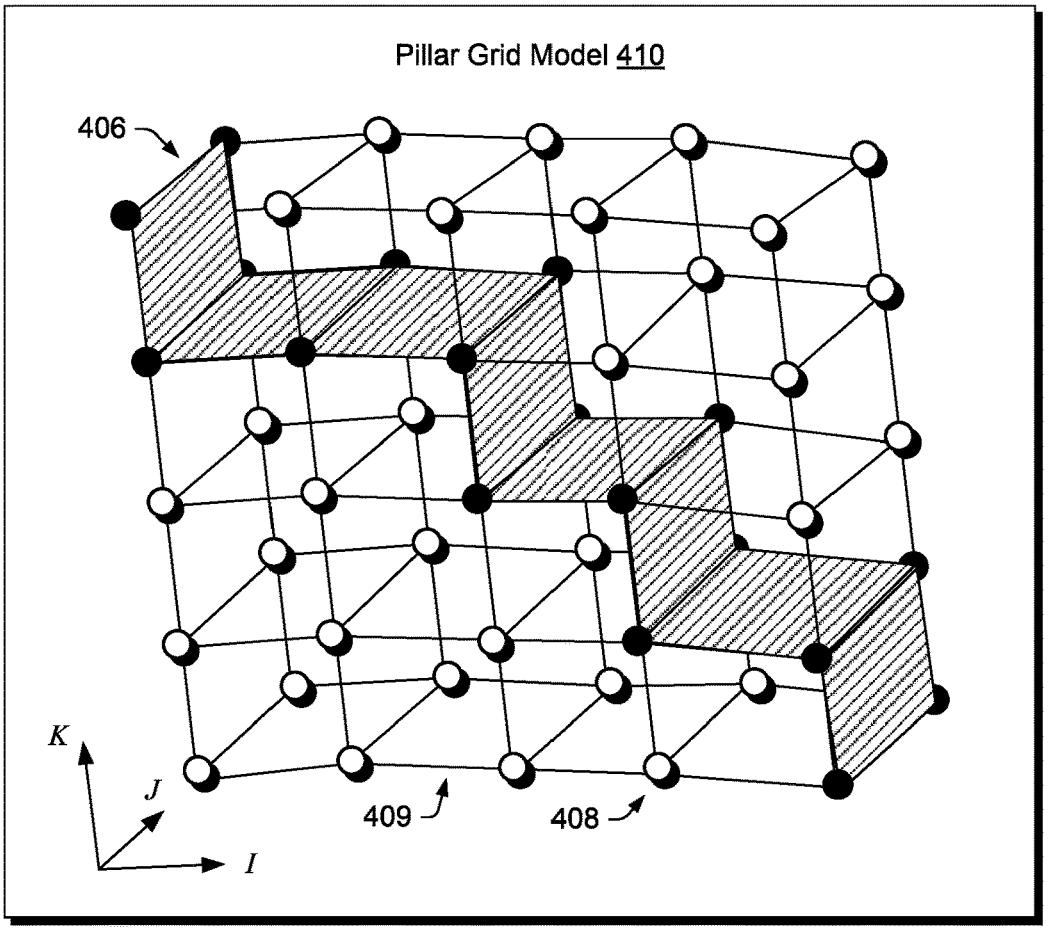

FIG. 4 shows an example of a faulted grid 405 that includes a stairstepped portion that represents a fault 406 in a geologic environment. FIG. 4 also shows an example of a portion of a pillar grid model 410 that includes nodes 408 and connections 409 where connections along the K index of an I, J, K index reference system can correspond to pillars. As shown, the pillar grid model 410 includes a stairstepped representation of the fault 406; whereas, in an actual geologic environment, a fault is unlikely to be spatially stairstepped in a manner that corresponds to a pillar grid, particularly given resolution of a pillar grid. As an example, the pillar grid model 410 may provide for representations of horizons where one or more horizons may be shifted in part in a direction of the K index such that on one side of the stairstepped representation of the fault 406, a horizon has a first K index and on the other side of the stairstepped representation of the fault 406, the same horizon has a second, different K index. In other words, faulting may a shift horizon such that a horizon is discontinuous across a fault.

Figure 5:
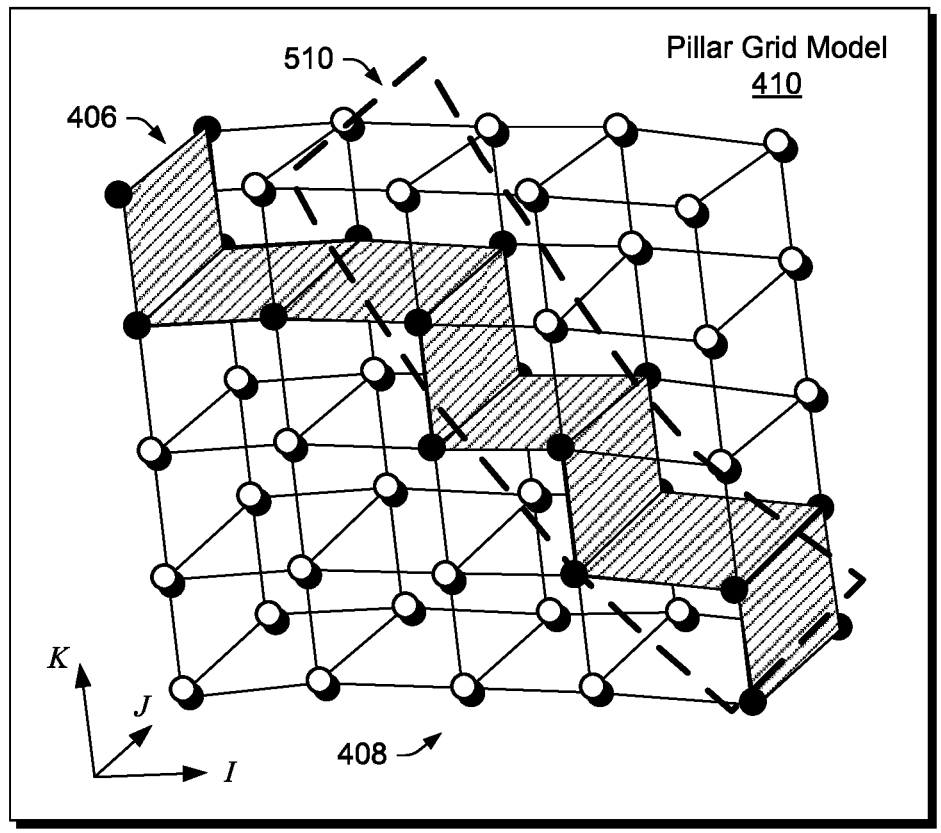
FIG. 5 illustrates an example of a grid model with respect to a surface and an example of a projection technique.

FIG. 5 shows the pillar grid model 410 of FIG. 4 as including a fault surface 510, which may be a physically more accurate representation (e.g., more realistic) when compared to the stairstepped representation of the fault 406. Or, in other words, the stairstepped representation of the fault 406 may be an approximation of the fault surface 510 in a discretized space defined by orthogonal coordinates (e.g., I, J and K index direction). As an example, a fault may be planar and may dip at an angle that is offset from one or more of the indexes I, J and K. As such, a fault may not be positioned or aligned with one or more coordinate system directions, again, which can be a reason for approximating a fault via stairstepping.

Stairstepping can be employed to maintain grid characteristics. For example, it may be desirable to maintain grid cell shapes for purposes of computations such as, for example, to aid in one or more of numerical stability in iterative solution techniques, array handling, etc. As an example, stairstepping may be employed to facilitate use of indexing such as, for example, the I, J and K indexing shown in FIG. 5, which may carry over to arrays in a numerical solver that solves systems of equations defined spatially with respect to a pillar grid model. However, as a fault in nature may differ spatially from a stairstepped representation thereof in a pillar grid model, a system of equations when solved for a stairstepped representation of a fault may provide a solution (e.g., as to pressure, flow, etc.) that does not adequately match natural phenomena, particularly near a fault (e.g., or other discontinuity).

Figure 6:
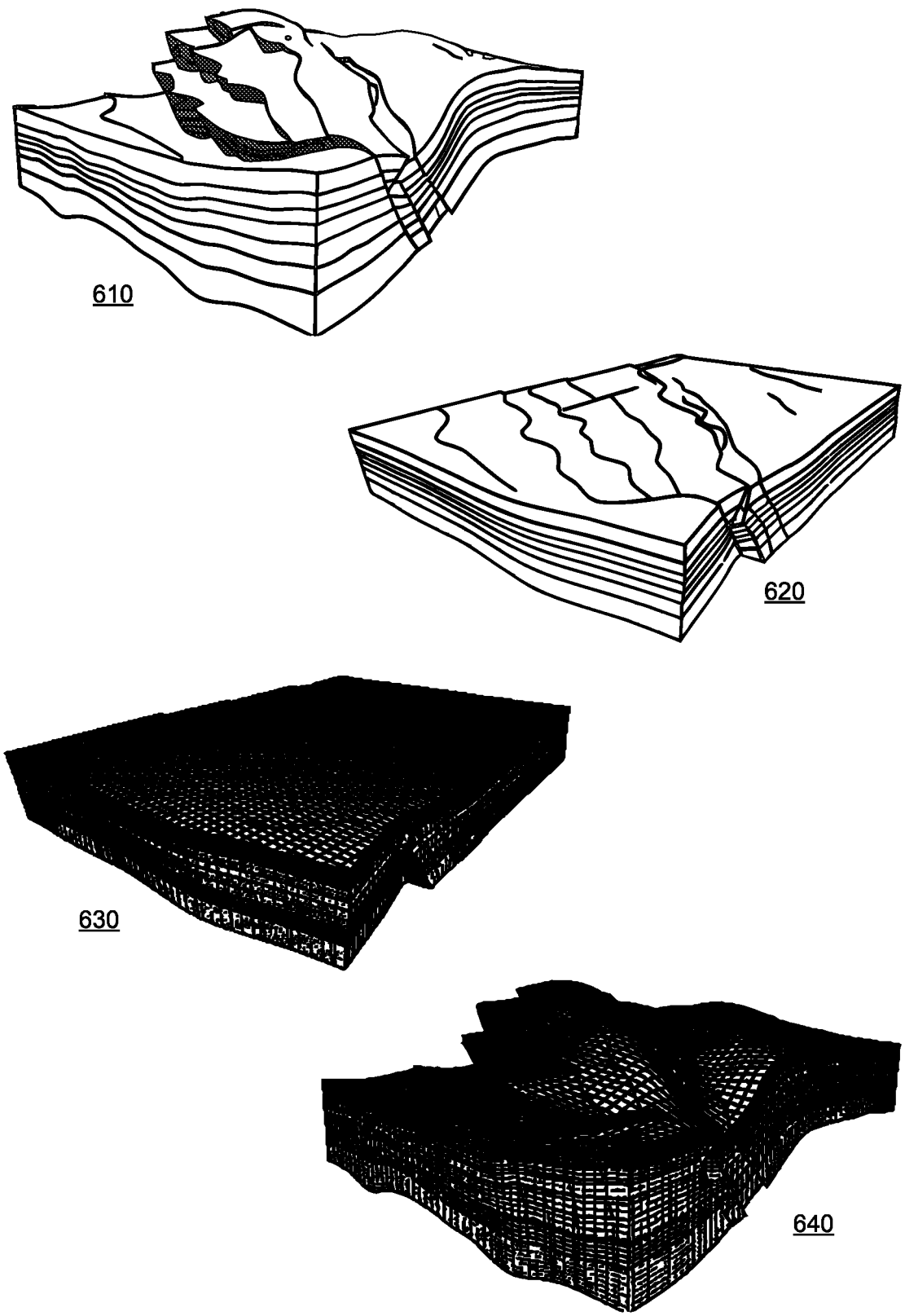
FIG. 6 illustrates examples of representations of a subterranean environment.

FIG. 6 shows various structural model representations of a geologic environment, specifically a structural model 610, a deposition space model 620, a sliced model 630 and a deposition grid (depogrid) model 640. Such models are based at least in part on data acquired using one or more types of sensors. Various subterranean features are not visible to the human eye and therefore instruments are utilized to explore, measure, sense, etc., subterranean materials (e.g., rock, fluid, etc.).

A three-dimensional stereoscopic film (also known as three-dimensional film, 3D film or S3D film) is a motion picture that enhances the illusion of depth perception, hence adding a third dimension. A common approach to the production of 3D films is derived from stereoscopic photography. In such an approach, a regular motion picture camera system is used to record the images as seen from two perspectives (e.g., or computer-generated imagery generates the two perspectives in post-production), and special projection hardware and/or eyewear are used to limit the visibility of each image to the viewer's left or right eye.

Rather than regular motion picture camera systems, which generate light image data (e.g., pixels, color model data, etc.), exploration of a subterranean region utilizes different types of data as can be acquired via tools such as downhole tools that can be positioned in a borehole and/or surface tools that can emit and/or acquire seismic energy (e.g., reflection seismology, etc.). In 3D film and in exploration of the Earth, ultimately a model is generated that allows for enhanced visualization or, as to the Earth, one or more types of other processing that can help to inform decision making, field operations (e.g., drilling, fracturing, etc.), etc.

In FIG. 6, the various models provide a description of the creation of a depogrid (e.g., a type of model) from a structural model. The structural model 610 in geological space is transformed (e.g., one-to-one and invertible mapping) to a depositional space (depospace) model 620 in which conformable horizons are horizontal planes (e.g., according to depositional processes of material). The depositional space is represented by an orthogonal coordinate system (u, v, w), with the vertical coordinate w defining a geological time parameter. The structural model in depospace can be sliced uniformly in the u and v directions, and each zone is divided by a specified number of planes in the w direction to generate the resulting sliced model 630, which is a grid model. Faults can be represented precisely as cut cells of this grid in depositional space. The inverse mapping applied to the grid of the sliced model 630 in the depospace recovers the depogrid in geological space as represented by the depogrid model 640. The cut cells are independently transformed to geological space to accurately represent the original fault framework model. For example, compare the depogrid model 640 to the structural model 610.

In the modelling of the subsurface within an exploration and production framework, structured grids may be generated at varying scales that are suitable for geological modelling, simulation, planning of field operations, execution of field operations, control of field operations, etc.

The generation and use of structured grids provides some particular benefits at different stages of the modelling and simulation end-to-end workflow, where a system may make use of the logical (I, J, K) neighboring of cells to infer relationships when modelling grid properties and the along- and through-layer cell directions. The latter benefit may be employed in reservoir simulation to simplify the cell-cell transmissibility calculations; however, such simplification introduces errors as the grid cells become less cuboid in nature (e.g., as internal angles deviate from 90 degrees).

A mentioned with respect to FIG. 4 and FIG. 5, one approach to producing structured grids is referred to as pillar gridding, in which faults can be smooth surfaces and the grid has a specified number of cells in the three grid directions. Such gridding approaches demand simplification of the faults in complex geological settings (e.g. when faults converge vertically; Y or X faults), and can lead to both substantial cell distortions and a large range in grid cell sizes, the latter issue being problematic for grid property modelling.

A stairstep grid is a type of structured grid that tends to be quite suitable for reservoir simulation applications. The sides of the grid cells and the K coordinate lines are vertical, and the grid layer geometry is identified by corner points down pillars. Whilst stairstep grids allow for more complex geological settings to be modelled, the faults remain stairstepped through the grid both laterally and vertically, and this can reduce the accuracy of geological reservoir modelling. Some approaches to handle such accuracy may define split cells (in geological space) at the fault location that aim to accurately represent the fault surface and the fault-horizon geometries. Stairstepped structured grids, by their geometry, introduce spatial inaccuracies. These spatial inaccuracies can impact simulation of physical phenomena, particularly directional physical phenomena such as fluid flow (e.g., fluid dynamics), which tends to depend on permeability of rock formation(s) as a directional property. As a simulation grid can be of a fluid flow simulator that generates simulation results as to how fluid flows in a subterranean environment that includes a reservoir, inaccuracies due to geometrical adherence to a stairstepped representation of a fault can lead to inaccuracies in simulation results, which, in turn, can lead to inaccuracies in placement of a well that aims to produce fluid from a subterranean reservoir that is simulated by the fluid flow simulator.

Grids that lack the neat coordinates and numbering conventions of structured grids can be referred to as unstructured grids. As an example, an unstructured grid can be used to model a fault without using strict, geometrical stairstepping. As such, a fault may be represented using a grid where cells of the grid conform geometrically to the fault, which may be understood via seismic imaging or other technological process that can determine locations of structures in the Earth. As an example, an imaging process can acquire data, which may be referred to as image data. An imaging process can include surface imaging and/or subsurface imaging technologies (e.g., surface seismic, surface satellite imagery, downhole seismic, downhole logging, etc.). As an example, input data to a modelling process can allow for creation of a volumetric model in geological space, before being transformed geomechanically into a depositional space in which conformable horizons are represented as horizontal planes where fault offsets are removed. For example, a layer may be shifted vertically due to faulting that creates a fault. A conformable horizon can span the fault where an offset from one side of the fault to the other side of the fault for that layer may be removed. As an example, gridding can occur in the depositional space where faults can be accurately represented using cut cells in the depositional space. The application of the inverse transformation to the grid in depositional space can generate a grid in the geological space (e.g., the depogrid) that can more accurately represent an original volumetric model of geologic environment while honoring stratigraphy of that geologic environment. Accurate modelling of depositional properties of such an unstructured depogrid in geological space benefits from knowledge of the depositional directions in which the grid properties, in particular directional properties such as permeability, were assumed to originate.

As an example, a workflow can improve reservoir simulator grid generation of a geological environment in a manner that provides for improved representation of directional properties of the geologic environment, which, in turn, improves operation of a computational reservoir simulator that generates simulation results as to one or more physical phenomena that are occurring or that may occur in the geological environment. For example, improved representation of directional properties of a reservoir simulator grid can improve operation of a computational reservoir simulator by assuring that directional properties are represented according to natural processes that may have occurred over a geologic time frame. Such natural processes tend to be driven by real-world physics noting that reservoir simulator equations model real-world physics. Closely matching directional properties to their actual, physical properties helps to keep a reservoir simulator grid in conformance with real-world physics. Such an approach can result in improved operation of a reservoir simulator and/or improved results.

As an example, improved operation can result from fewer inaccuracies as to directional properties, which can provide for enhanced convergence of a solution to a fluid flow problem. Enhanced convergence can mean a fewer number of iterations (see, e.g., FIG. 12), which can translate into lesser operational time or use of lesser computational resources (e.g., CPUs, cores, memory, etc.).

As an example, as to improved results, improved representation of directional properties at a fault can result in improved reservoir simulator generated results as to fluid flow at the fault and even at a distance from the fault. For example, if directional properties are inaccurate at a fault, a solution of a reservoir simulator to a fluid flow problem can be inaccurate at a distance from the fault. As an example, consider linear flow, which is defined as a flow regime characterized by parallel flow lines in a reservoir. Such phenomena can results from flow to a fracture or a long horizontal well, or from flow in an elongated reservoir, such as a fluvial channel, or as a formation bounded by parallel faults.

As an example, a reservoir simulator can simulate physical phenomena for a producing reservoir, a reservoir to be produced, etc. For example, a producing reservoir can be in fluid communication with one or more wells where at least one of the wells is a production well (e.g., consider an injection well as another type of well). As to a reservoir to be produced, a reservoir simulator can include a reservoir simulator grid with a representation of one or more wells. In either instance, accuracies of directional properties can affect operation of the reservoir simulator.

As an example, a workflow can utilize depositional mapping to both analyze a depogrid and to more accurately model and simulate directional properties. Such a workflow can include:
  Generation of a structural model, performance of a depo-space transformation, generation of a grid in a depositional space, and generation of a depogrid in a geological space;
  Use of a depositional-geological space mapping to estimate local axes for depogrid cells;
  Analysis of the local axis orientations and dimensions for each grid cell in a geological space to characterize actual and/or potential local grid errors arising from errors in input data; and
  Orthonormalization of the grid axes, as appropriate, and representation of directional properties in the depogrid for consumption by a reservoir simulator.

As described above, the modelling and simulation of the subsurface in various frameworks tends to employ structured grids. Such grids include approximations at different stages of an end-to-end workflow.

As mentioned, an alternative to a structured grid may be an unstructured grid. As an example, consider unstructured depogrids and benefits of accurate modelling of geological inputs and more accurate simulation of such depogrids, for example, by refraining from or reducing the amount of simplifications made when using structured grids.

The conceptual generation of a depogrid is illustrated in FIG. 6 using the initial structural model 610, a transformation of this geological model to the depositional space (depospace) model 620, the division of this model in depospace according to the (orthogonal) u, v and w directions to generate the sliced model 630, and a transformation back to the geological space to define the faulted depogrid model 640. The transformation to depositional space may define a one-to-one mapping between points in the structural model (geological space) and points in the corresponding model in depospace. The depogrid faults and horizons can accurately match those of the original structural model, while the additional grid layers between horizons (e.g., seismic horizons) can honor the stratigraphic nature of the depositional mapping. When viewed in the geological space, the w coordinate lines can retain their orthogonal relationship with the local horizons (e.g., seismic horizons) as enforced in depositional space.

As to a one-to-one mapping, it can be that a point located on a fault surface of a structural model in geological space will correspond to two (or more at fault-fault intersections) points in depospace, as the point will be separately considered to lie on each of the two sides of that fault. Each point on the fault surface can therefore be represented by several colocated points that have their own, different depospace locations.

Figure 7:
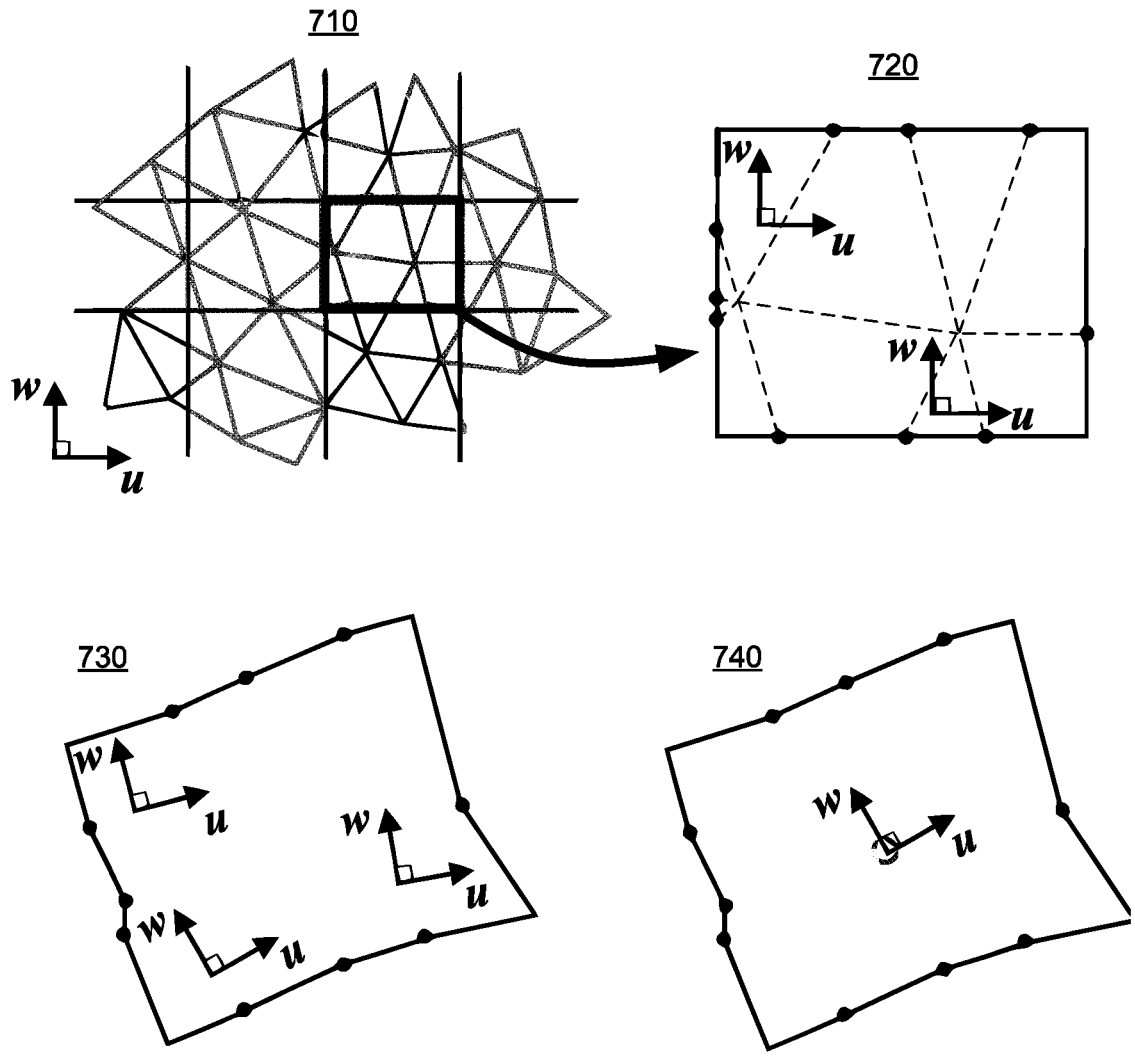
FIG. 7 illustrates examples of grid cells.

FIG. 7 shows the representation of (u, v, w) directions during a depogrid creation workflow. Specifically, a grid 710 with a grid cell, a depogrid cell 720, a grid cell in geological space with multiple spatially varying axis systems 730 and a grid cell in geological space with a single axis system 740.

As represented in the grid 710, a structural model can be built from tetrahedra (see, e.g., triangles in the 2D representation) or other suitable volumetric geometric entities. In depositional space the defined (u, v, w) directions can be used to slice up the structural model volume (see the model 630 of FIG. 6). The depogrid cell 720 in depositional space as shown in FIG. 7 represents the aggregation of the sliced tetrahedra of the structural model. The faces of the depogrid cell 720 represent the original faces of the sliced tetrahedra. Each point within the depogrid cell 720 can have the same definition of u, v and w axes. When mapped back to geological space as shown in FIG. 7 by the grid cell 730, the faces of that cell become distorted; note that the u, v and w axes are spatially varying (see, e.g., three examples of sets of axes). As shown in the grid 740 of FIG. 7, based on a volumetric centroid, a single representative orthogonal u, v and w axis system can be utilized for each depogrid cell in geological space; noting that the spacing of nodes and boundaries shown can be conforming to geological structural shape(s). For example, consider the left side where there is a jog inwardly and a jog outward, which may be present to conform to the shape of a geological structure in the Earth.

As an example, a depogrid can be generated by first uniformly gridding a structural model in depositional space (see the model 630 of FIG. 6) so that one or more faults are represented relatively precisely as cut cells, and then transforming this grid back to geological space using the one-to-one inverse mapping (see the model 640 of FIG. 6). By construction, each point in depositional space interprets its local (u, v, w) direction to be equal to the global (u, v, w) direction (see, e.g., FIG. 7). The application of the inverse mapping to recover the depogrid means that each point in geological space (each point inside each depogrid cell) potentially "understands" the local (u, v, w) direction differently (see grid 730 of FIG. 7), although (u, v, w) orthogonality on the elemental scale is preserved.

Local (u, v, w) directions for an individual depogrid cell demand approximation based on available information, for example, the variations of (u, v, w) and (global) physical (x, y, z) coordinates within the depogrid cell (see FIG. 7).

As an example, a method can be implemented that includes determining these local u, v and w axes for each of a plurality of depogrid cells, for example, using the volumetric centroid and vertices represented in (u, v, w) and (x, y, z) coordinates. In such an approach, these axes allow geological defined directional grid properties, which were conceptually modelled in depositional space, to be interpreted in the global coordinate system. The properties of these local u, v and w axes can be used to infer grid attributes, for example, as part of quality checking such a process.

As an example, it may be demonstrated how a resulting tensor permeability property for each cell of a plurality of cells can be consumed by a more accurate cell-cell transmissibility calculation within a reservoir simulator, leading to a higher degree of numerical accuracy in representing one or more physical phenomena that may occur in a geologic environment (e.g., in a reservoir, etc.).

Generation of Averaged u, v and w Axes for a Depogrid Cell

The generation of a representative single local u, v and w axes for a depogrid cell can therefore represents an averaged (upscaled) orientation of that cell based on the variation of the actual local u, v and w axis directions within the cell (see the grid 740 of FIG. 7). An initial averaged (non-orthogonal) u, v and w axes for a depogrid cell can be determined based on the local variations of the (u, v, w) values (e.g., the (u, v, w) coordinates of the corresponding points in depositional space) and the global (x, y, z) coordinates within that cell.

Figure 8:
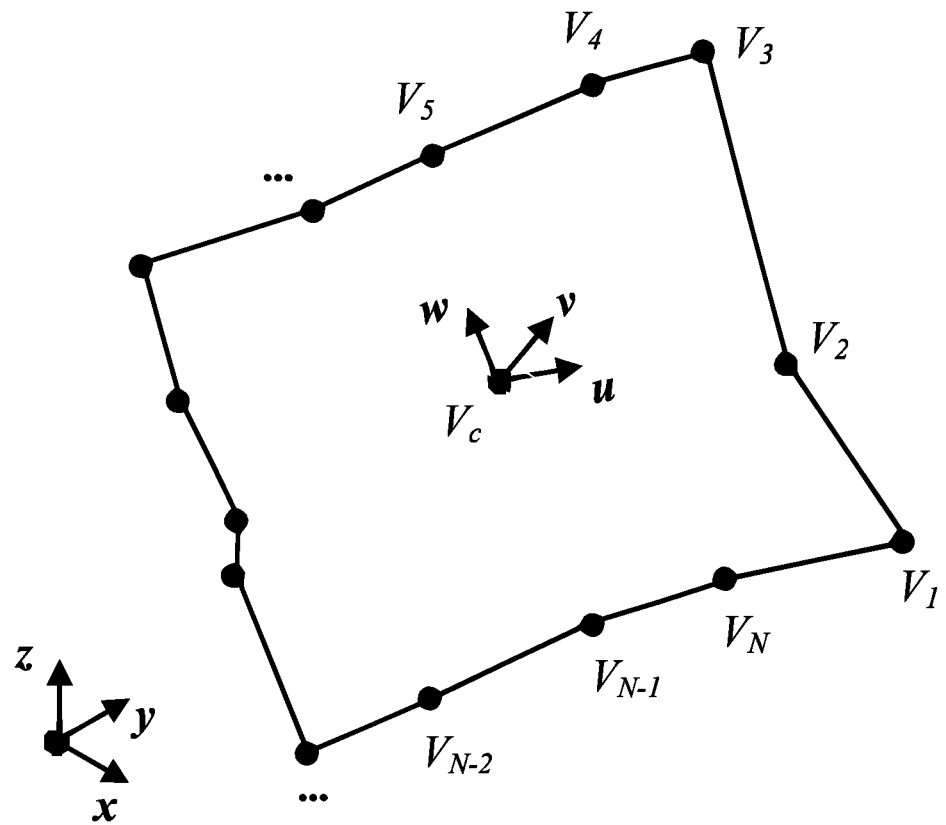
FIG. 8 illustrates an example of one of the grid cells of FIG. 8 in a three-dimensional space.

FIG. 8 shows the depogrid cell 740 of FIG. 7 as having N vertices $V_1, \ldots, V_N$. The depogrid cell 740 has a local (non-orthogonal; non-degenerate) coordinate system based on u, v and w axes. As described in FIG. 7, these axes are 'representative' of the (u, v, w) directions within the depogrid cell, and are calculated at the volumetric centroid $V_c$ of the cell. Any point in the cell can also be described with reference to a global orthonormal coordinate system based on unit x, y and z axes.

The N vertices of the faces of a depogrid cell are shown in FIG. 8 and have been labelled $V_i$, for $i=1, \ldots, N$. The averaged u, v and w axes for the depogrid cell is to be defined relative to a single point for the depogrid cell; a method can choose the volumetric centroid $V_c$ to be this reference point (in the case of a concave cell, the point $V_c$ could be outside the cell).

The transformation between depositional space and geological space allows for describing the centroid and each vertex of the depogrid cell by both its (u, v, w) and (x, y, z) values:

$$V_c=(u_c,v_c,w_c), V_i=(u_i,v_i,w_i), i=1,\ldots,N \quad (1a)$$

relative to local u, v, w axes, $$V_c=(x_c,y_c,z_c), V_i=(x_i,y_i,z_i), i=1,\ldots,N \quad (1b)$$

relative to global x, y, z axes.

The local u, v and w axes at $V_c$ are unknown, and a method can denote the representation of these vectors relative to x, y and z axes as follows:

$$u=(x_u,y_u,z_u)^T, v=(x_v,y_v,z_v)^T, w=(x_w,y_w,z_w)^T. \quad (2)$$

Then the vector displacement of $V_i$ from $V_c$ can be described in the two coordinate systems as:

$$(x_i-x_c, y_i-y_c, z_i-z_c)^T = (u_i-u_c)u + (v_i-v_c)v + (w_i-w_c)w \quad (3)$$

or $$\begin{pmatrix} \Delta x_i \\ \Delta y_i \\ \Delta z_i \end{pmatrix} = (\Delta u_i)u + (\Delta v_i)v + (\Delta w_i)w = \begin{pmatrix} u & v & w \end{pmatrix} \begin{pmatrix} \Delta u_i \\ \Delta v_i \\ \Delta w_i \end{pmatrix}, \quad (4)$$

where $\Delta x_i = x_i - x_c$, $\Delta u_i = u_i - u_c$, and similarly for $\Delta y_i$, $\Delta z_i$, $\Delta v_i$ and $\Delta w_i$. Applying Equation (4) for each i, with $i=1, \ldots, N$, it is possible to obtain:

$$\begin{pmatrix} \Delta x_1 & \ldots & \Delta x_N \\ \Delta y_1 & \ldots & \Delta y_N \\ \Delta z_1 & \ldots & \Delta z_N \end{pmatrix} = \begin{pmatrix} u & v & w \end{pmatrix} \begin{pmatrix} \Delta u_1 & \ldots & \Delta u_N \\ \Delta v_1 & \ldots & \Delta v_N \\ \Delta w_1 & \ldots & \Delta w_N \end{pmatrix}, \quad (5)$$

where these (over-determined and generally inconsistent) conditions on the u, v and w axes will allow for determining the axes in a least-squares sense. Right multiplication of Equation (5) by $$\begin{pmatrix} \Delta u_1 & \Delta v_1 & \Delta w_1 \\ \vdots & \vdots & \vdots \\ \Delta u_N & \Delta v_N & \Delta w_N \end{pmatrix}$$

then gives $$\begin{pmatrix} \Delta x_1 & \cdots & \Delta x_N \\ \Delta y_1 & \cdots & \Delta y_N \\ \Delta z_1 & \cdots & \Delta z_N \end{pmatrix} \begin{pmatrix} \Delta u_1 & \Delta v_1 & \Delta w_1 \\ \vdots & \vdots & \vdots \\ \Delta u_N & \Delta v_N & \Delta w_N \end{pmatrix} = \quad (6a)$$

$$(u \quad v \quad w) \begin{pmatrix} \Delta u_1 & \cdots & \Delta u_N \\ \Delta v_1 & \cdots & \Delta v_N \\ \Delta w_1 & \cdots & \Delta w_N \end{pmatrix} \begin{pmatrix} \Delta u_1 & \Delta v_1 & \Delta w_1 \\ \vdots & \vdots & \vdots \\ \Delta u_N & \Delta v_N & \Delta w_N \end{pmatrix}$$

or $$\begin{pmatrix} \sum_{i=1}^N \Delta x_i \Delta u_i & \sum_{i=1}^N \Delta x_i \Delta v_i & \sum_{i=1}^N \Delta x_i \Delta w_i \\ \sum_{i=1}^N \Delta y_i \Delta u_i & \sum_{i=1}^N \Delta y_i \Delta v_i & \sum_{i=1}^N \Delta y_i \Delta w_i \\ \sum_{i=1}^N \Delta z_i \Delta u_i & \sum_{i=1}^N \Delta z_i \Delta v_i & \sum_{i=1}^N \Delta z_i \Delta w_i \end{pmatrix} = \quad (6b)$$

$$(u \quad v \quad w) \begin{pmatrix} \sum_{i=1}^N (\Delta u_i)^2 & \sum_{i=1}^N \Delta u_i \Delta v_i & \sum_{i=1}^N \Delta u_i \Delta w_i \\ \sum_{i=1}^N \Delta u_i \Delta v_i & \sum_{i=1}^N (\Delta v_i)^2 & \sum_{i=1}^N \Delta v_i \Delta w_i \\ \sum_{i=1}^N \Delta u_i \Delta w_i & \sum_{i=1}^N \Delta v_i \Delta w_i & \sum_{i=1}^N (\Delta w_i)^2 \end{pmatrix}$$

Hence $$(u \quad v \quad w) \begin{pmatrix} x_u & x_v & x_w \\ y_u & y_v & y_w \\ z_u & z_v & z_w \end{pmatrix} = \quad (7)$$

$$\begin{pmatrix} \sum_{i=1}^N \Delta x_i \Delta u_i & \sum_{i=1}^N \Delta x_i \Delta v_i & \sum_{i=1}^N \Delta x_i \Delta w_i \\ \sum_{i=1}^N \Delta y_i \Delta u_i & \sum_{i=1}^N \Delta y_i \Delta v_i & \sum_{i=1}^N \Delta y_i \Delta w_i \\ \sum_{i=1}^N \Delta z_i \Delta u_i & \sum_{i=1}^N \Delta z_i \Delta v_i & \sum_{i=1}^N \Delta z_i \Delta w_i \end{pmatrix}$$

$$\begin{pmatrix} \sum_{i=1}^N (\Delta u_i)^2 & \sum_{i=1}^N \Delta u_i \Delta v_i & \sum_{i=1}^N \Delta u_i \Delta w_i \\ \sum_{i=1}^N \Delta u_i \Delta v_i & \sum_{i=1}^N (\Delta v_i)^2 & \sum_{i=1}^N \Delta v_i \Delta w_i \\ \sum_{i=1}^N \Delta u_i \Delta w_i & \sum_{i=1}^N \Delta v_i \Delta w_i & \sum_{i=1}^N (\Delta w_i)^2 \end{pmatrix}^{-1}$$

Equation (7) allows for calculating the least-squares approximations to the local vector directions u, v and w based on the vertices and centroid of the depogrid cell. As mentioned, the u, v and w axes may not be orthogonal.

Analysis of Grid Geometry and Depositional Transform Based on u, v and w Axes

The u, v and w axes defined in geological space, using the approach in the previous section, can be analyzed to infer features, for example, in the original input data used to generate the structural model or in the depospace transform.

Deviation from Orthogonality of Local Coordinate System and Use in Grid Quality Checking As explained in the previous section, the global orthogonal u, v and w axes in depospace of a point inside the structural model transform back to local orthogonal u, v and w axes in geological space. The loss of orthogonality can arise by an attempt to define a single representative set of local u, v and w axes for the cells of the depogrid in geological space. These "averaged" axes can be quite non-orthogonal due to local distortions when applying the depospace transform, and may arise due to locally inconsistent fault or horizon interpretations.

A measure of the non-orthogonality of the local axes is the angle between u and v×w, the angle between v and w×u, or the angle between w and u×v, which will be zero for orthogonal local coordinates. This deviation angle provides a measure of how much angular distortion a cell experienced when being transformed from depospace to geological space, and areas of high deviation can be analyzed to isolate problems in the structural model (e.g., the input data) or the application of the depospace transform.

A depospace transform will tend to naturally lead to local rotations of parts of the structural model. A measure of the actual local rotation is the angle between the local u axis of the depogrid cell and the globally defined u direction of the depospace slicing, and similarly for the v and w directions. The local rotation is to be analyzed relative to the general rotation of the neighboring cells (e.g., the rotation of the fault block), as well as geological considerations of expected rotations of the u, v and w axes. In particular, the local w axis in geological space will tend to naturally be quite different to the vertical w axis in depositional space, and the local rotation of this axis can be understood in comparison to the geological environment and deviations from the expected local rotation.

As explained in the next section, local cell axes can be orthogonalized before application in reservoir simulation. This can be achieved by locally adjusting the calculated u, v and w axes, and one approach is to make small rotations of these axes within the planes containing u and v, v and w, or u and w. If particular rotations are not considered small then again this may indicate problems in the structural model or the depospace transform, as well as a cell demanding large and potentially inconsistent axis (and associated property) adjustments to allow it to be used for reservoir simulation. Another useful measure of axis orthogonality is therefore the deviation of each of the angles between u and v, v and w, and u and w from 90 degrees.

Measurements of Local Length Change Between Depositional and Geological Space

The vectors u, v and w represent a displacement of one unit change in the u, v and w values, respectively. For a single point in geological space, the local u, v and w axes can be a rotation of the corresponding axes in depositional space, where the units of u, v and w are defined by the uniform spatial slicing described in FIG. 6(c). The u and v uniform spatial slicing of the volume is defined to use the increment Δu and Δv. Each zone of the model may be modelled with a specified number of layers, so within a single zone the w slicing may also be uniform and an expected thickness Δw can be estimated. The deviation of the magnitudes of the vectors u, v and w from these specified increments indicates the degree of directional deformation (contraction or expansion) of the depogrid cell in geological space; the measurement of this property may be understood as the ratio of the axis length in geological space to the corresponding expected increment. Note that if no distortion has occurred then the local u, v and w axes of a cut cell will be the same as those of the non-cut cells, and their magnitudes will therefore honor the specified increments.

Orthonormalization of the u, v and w Axes

A method can include determining local cell axes that can be used to represent the principal permeability directions. The tensor permeability of a cell can be assumed to be positive definite (since by definition the flow can be in the direction opposite to the local pressure gradient) and symmetric. This real symmetric permeability tensor is diagonalizable with reference to an orthogonal basis, and this demands generation of the orthogonal principal (unit) û, v̂ and ŵ local axes given the non-orthogonal u, v and w axes.

As an example, an approach to generating the orthogonal axes can include first ignoring the given w direction and assuming that û and v̂ lay within the plane defined by the non-orthogonal (but non-parallel) u and v vectors. Thus ŵ is a unit vector in the direction of u×v. It may be demanded that û and v̂ are be closely aligned with u and v, but also more closely aligned with the longer of u and v. This can be achieved by rotating v through 90 degrees in the plane containing u and v and then adding it to u, namely û is a unit vector in the direction of u+v×ŵ. Similarly, v̂ is a unit vector in the direction of v−u×ŵ.

One or more of various alternative approaches to creating the orthonormal local axes may be applied. Accuracy of calculated non-orthogonal u, v and w axes can depend on the local depospace transform in combination with the local input data, and measures of this accuracy were discussed in the previous section. The confidence in the individual axis orientation defined using these measures may be incorporated into a simple minimization process to generate a better orthonormal local basis.

Representing Tensorial Properties in the Depositional and Geological Spaces

Given the geological grid (in this case depogrid) 640 of FIG. 6, a method can generate a variety of geological properties for one or more of a variety of downstream applications, such as, for example, one or more of volumetric analysis and reservoir simulation. As mentioned, such a grid can improve the operation of a reservoir simulator, which is a specialized computational machine, and/or improve simulation results generated by a reservoir simulator.

In various contexts, of particular interest is the representation of tensorial properties (e.g., consider the permeability tensor) within a workflow of FIG. 6. A general assumption may be that there is an aim to populate directional geological properties in a manner that will consider that directions are relative to depositional space. Thus, a directional geological property can be defined with reference to the global u, v and w axes of the depogrid viewed in depositional space (see, e.g., the grid 710 of FIG. 7), but these directions are to be appropriately represented within the cells of the depogrid viewed in geological space (see, e.g., the grid cell 730 of FIG. 7). Within the constraints of grid resolution, a definition of a directional geological property can therefore be relative to the representative u, v and w axes of each depogrid cell (see, e.g., the grid cell 740 of FIG. 7).

The permeability tensor within each cell of a depogrid in depositional space can be a symmetric tensor relative to the orthonormal û, v̂, ŵ axes:

$$K = \begin{pmatrix} K_{uu} & K_{uv} & K_{uw} \\ K_{uv} & K_{vv} & K_{vw} \\ K_{uw} & K_{vw} & K_{ww} \end{pmatrix}. \tag{8}$$

A common situation of a lateral (along layer; isotropic relative to u and v) permeability of $K_{horiz}$ and orthogonal through-layer permeability of $K_{vert}$ corresponds to $K_{uu}=K_{vv}=K_{horiz}$, $K_{uv}=K_{uw}=K_{vw}=0$, $K_{ww}=K_{vert}$.

The Representation of Directional Permeability in Reservoir Flow Simulators Structured Grids:

In a structured grid cell-cell connections can be described using the logical (I,J,K) indexing. For such grids, two-point flux approximations can be a discretization scheme employed within a reservoir simulator. A two-point scheme approximates the flux across a cell-cell interface by using the pressure difference between the two adjacent cells (neighboring or non-neighboring cells; based on pressures defined at the centroid of each cell). The two-point half-transmissibility $T_i$ of cell i (e.g., from the cell centroid $C_i$ to the centroid $C_f$ of the cell face along the cell-cell interface) is obtained by imposing flux and pressure continuity at the cell-cell interface and a linear variation of pressure within the cell:

$$T_i = \frac{1}{|d_i|^2} a_i^T K_i d_i, \tag{9}$$

where $K_i$ is the permeability tensor within cell i, $d_i$ is the vector from $C_i$ to $C_f$ and $a_i$ is the outward pointing area normal to the cell-cell interface.

The two-point flux approximation (9) is consistent and convergent if the grid is K-orthogonal, e.g., $a_i^T K_i$ is parallel to $d_i$. The local grid distortion and the use of a full permeability tensor can be two factors that can lead to a loss of K-orthogonality.

A full tensor permeability may be utilized to model complex reservoirs. The full tensor description can arise in complex cross-bedded systems or for fractured systems, but may arise through a grid property upscaling process applied to the detailed heterogeneous reservoir description at the geological scale.

A reservoir simulator may ignore the full tensor nature of the absolute permeability and assume that within a two-point flux approximation the permeability can be represented by a diagonal tensor whose principal axes coincide with the local coordinate axes, e.g., the axes defined by joining the midpoints of each pair of opposite faces in a hexahedral cell of a structured grid.

The multi-point flux approximation (MPFA) can be utilized to derive a more rigorous treatment of full tensor permeability in non K-orthogonal grids.

Unstructured Grids

As described previously, each cell in an unstructured depogrid can have a permeability tensor (see Equation (8)) described relative to local orthonormal û, v̂ and ŵ axes. The transmissibility between adjacent cells in an unstructured grid may be readily defined relative to global orthonormal x, y and z axes. The transformation of a vector V, defined relative to orthonormal cell local axes û, v̂ and ŵ, to the vector V', defined relative to orthonormal grid global axes x, y and z, can be represented by the matrix Q as follows:

$$V' = QV, \text{ where } Q = \begin{pmatrix} û \cdot x & v̂ \cdot x & ŵ \cdot x \\ û \cdot y & v̂ \cdot y & ŵ \cdot y \\ û \cdot z & v̂ \cdot z & ŵ \cdot z \end{pmatrix}. \tag{10}$$

and hence the cell permeability tensor K' relative to grid global x, y and z axes becomes $$K' = QKQ^T \tag{11}$$

The permeability tensor K' is symmetric (since K is symmetric) and positive definite (since the eigenvalues are the principal permeabilities and therefore positive).

Figure 9:
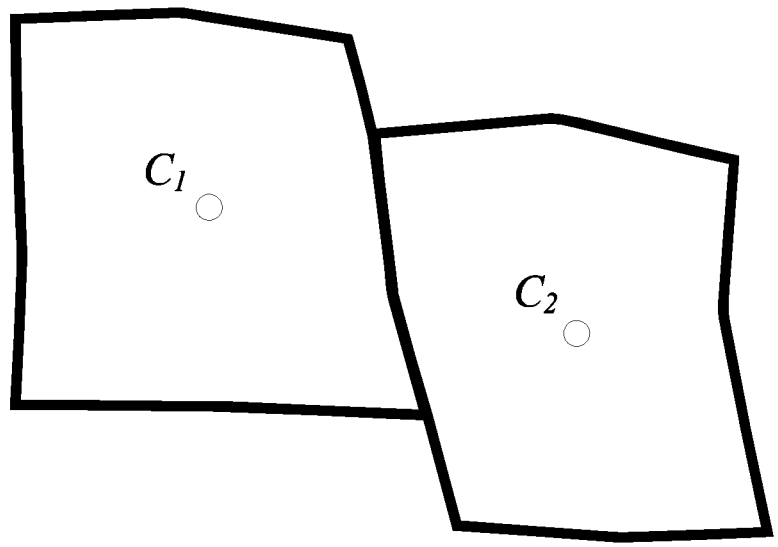
FIG. 9 illustrates an example of a method with respect to adjacent grid cells.
Figure 9:
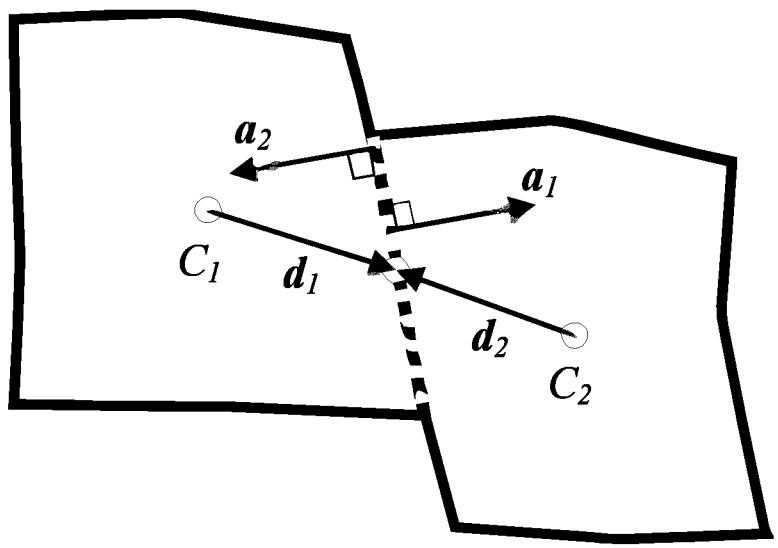

FIG. 9 shows an example of adjacent grid cells 910 and an example of an adjustment to the border between the adjacent grid cells 930. Specifically, FIG. 9 shows two adjacent cells 910 in an unstructured depogrid that can potentially meet at multiple common cell faces. At faults and unconformities (e.g., as well as for two cells not at faults or unconformities) such matching of faces can be guaranteed. The treatment of such a cell-cell connection can be similar to a structured grid, except that the separate half transmissibilities of the two cells each can utilize a common centroid P of aggregated common faces between cells 1 and 2, indicated by the dotted line in the adjusted adjacent grid cells 930 of FIG. 9. In the example of FIG. 9, the vector $d_i$ can be the vector from cell centroid $C_i$ to P. The vector $a_i$ for cell i can be the outward-pointing face area normal (e.g., direction normal to the face; magnitude equal to face area) for the cell-cell interface ($a_1 = -a_2$).

Unstructured depogrid cell-cell connections can include one or more connections as shown schematically in FIG. 9. The connection between two cells can take place over multiple shared faces, and by construction there is a match of the cell faces at the cell-cell interface. The approach taken to account for the flow between cells 1 and 2 in FIG. 9 can be to first aggregate the common overlap faces and to represent the interface between these two cells using the (area-weighted) centroid P and the area-weighted average normal of the individual faces. The transmissibility (see Equation (9)) can then be applied for flow between cells 1 and 2 over this aggregated face, which may be subject to errors introduced by the K-orthogonality assumption. As an example, an alternative approach can be to sum individual contributions over the shared faces between cells 1 and 2; however, such an approach may lead to increased K-orthogonality errors, for example, in scenarios of either a large number of cell-cell faces or complex and distorted interfaces between the two cells.

As an example, a method may be implemented without various simplifications, for example, as to treatment of the permeability tensor. For a structured grid, implementation may neglect use of a full tensor nature of the permeability; whereas, for an unstructured depogrid, an implementation can choose to apply the full tensor K' of Equation (11), which can be different for each cell of a grid.

As an example, a workflow can provide for more accurate modelling of directional depositional properties in a geological grid that represents a subterranean region where the grid is based on data acquired via one or more sensors. A geological grid (depogrid) can accurately match an original structural grid generated from input data; however, the depogrid discretization can be based on a one-to-one association to a "regular" discretization in depositional space. This depositional mapping and the estimated local grid cell axes can be used to analyze the depogrid quality and to more accurately model and simulate directional properties.

Figure 10:
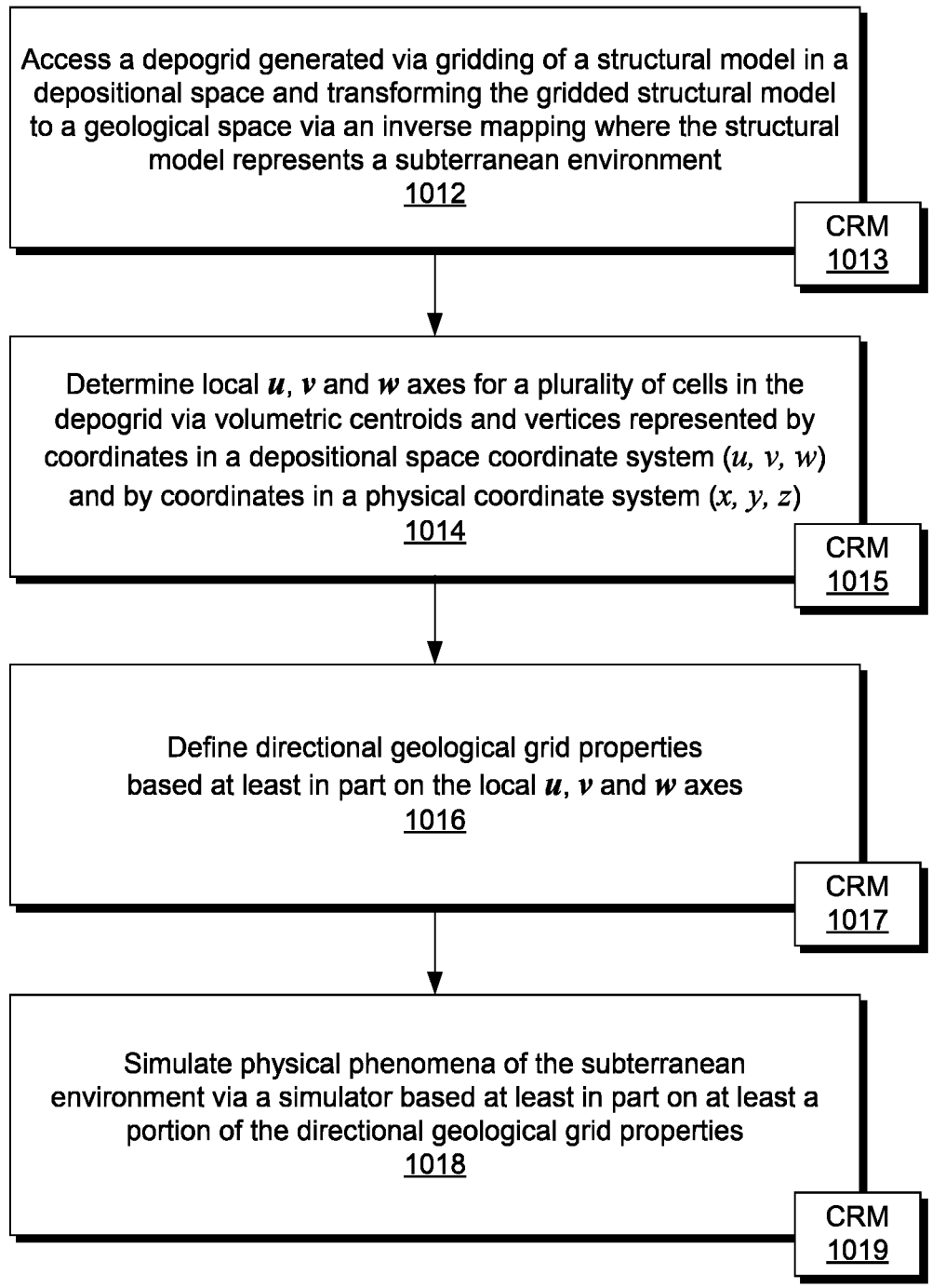
FIG. 10 illustrates an example of a method.

FIG. 10 shows an example of a method 1000 that includes an access block 1012 for accessing a depogrid generated via gridding of a structural model in a depositional space and transforming the gridded structural model to a geological space via an inverse mapping where the structural model represents structural features in a subterranean environment based at least in part on data acquired via at least one sensor; a determination block 1014 for determining local u, v and w axes for a plurality of cells in the depogrid via volumetric centroids and vertices represented by coordinates in a depositional space coordinate system (u, v, w) and by coordinates in a physical coordinate system (x, y, z); a definition block 1016 for defining directional geological grid properties based at least in part on the local u, v and w axes; and a simulation block 1018 for simulating physical phenomena of the subterranean environment via a simulator based at least in part on at least a portion of the directional geological grid properties.

The method 1000 is shown in FIG. 10 in association with various computer-readable media (CRM) blocks 1013, 1015, 1017 and 1019. Such blocks generally include instructions suitable for execution by one or more processors (or cores) to instruct a computing device or system to perform one or more actions. While various blocks are shown, a single medium may be configured with instructions to allow for, at least in part, performance of various actions of the method 700. As an example, the one or more blocks 1013, 1015, 1017 and 1019 may be instructions such as, for example, one or more of the sets of instructions 270 of the system 250 of FIG. 2.

Figure 11:
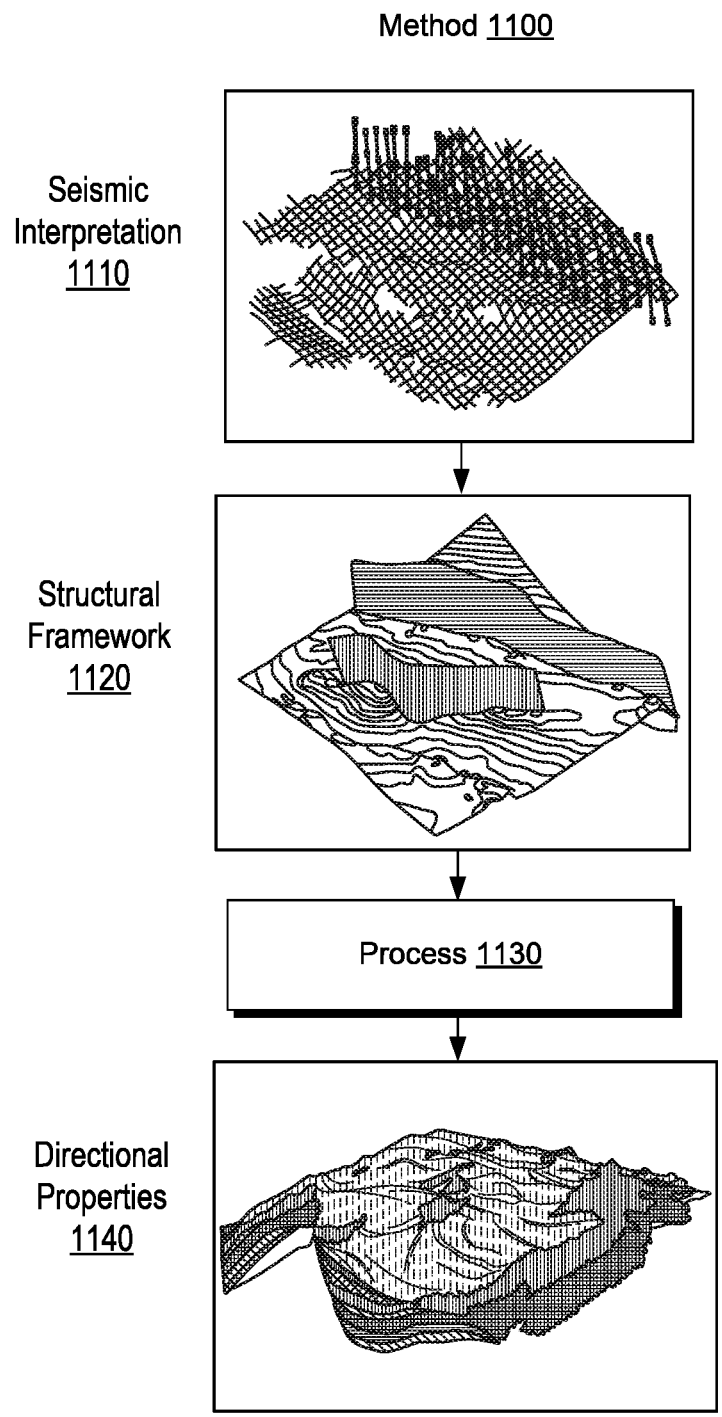
FIG. 11 illustrates an example of a method.

FIG. 11 shows an example of a method 1100 that includes a seismic interpretation block 1110 for accessing at least seismic data as acquired by one or more sensors that sense seismic energy that travels in a subterranean environment, for performing a seismic interpretation based at least in part on at least a portion of the data and generating information (e.g., locations of structures, etc.). The method 1100 also includes a structural framework block 1120 for generating one or more structures (e.g., structures within a model, etc.) that represent physical structures in the subterranean environment. For example, interpretation may identify a horizon and structural model can include that horizon as a data-based structure with a likelihood that it actually exists in the subterranean environment given variations in seismic data (e.g., variations in traces, etc.). The method 1100 includes a processing block 1130, which may implement one or more techniques that can enhance how properties are handled where such properties can include one or more directional properties, which can be assigned to portions of a grid per the property block 1140.

As an example, the directional properties as in the property block 1140 can be stored in association with the grid, for example, in a storage device. Such a storage device can be part of a reservoir simulator or otherwise accessible by a reservoir simulator via one or more interfaces. For example, consider a reservoir simulator that includes one or more processors and memory where data and/or instructions stored in a storage device can be loaded into the memory via operation of at least one of the one or more processors.

As mentioned, a method can include generation of a structural model, depospace transform, grid in depositional space, and depogrid in geological space. Such a method can include use of a depositional-geological space mapping to estimate local axes for depogrid cells. As an example, such a method can include analyzing local axis orientations and dimensions for one or more of a plurality of grid cells in a geological space, for example, to assess quality of local grid regions, which may help in understanding potential local grid errors that may arise from errors in the input data. In such an example, a method may call for one or more actions such as, for example, reprocessing data, acquiring additional data, etc. As an example, where a seismic survey is a 4D survey with a temporal dimension (e.g., series of 3D seismic data where each member in the series has an associated survey time), a method may include accessing one or more members of the series responsive to an indication that an error (e.g., an inaccuracy, etc.) exists.

As mentioned, a method can include orthonormalization of grid axes and, for example, representation of directional properties in depogrids. Such a method can be part of a workflow that includes one or more processes that utilize one or more directional properties. For example, consider a fluid flow simulation, which may be via one or more numerical methods (e.g., finite element, finite difference, etc.) where one or more equations that represent physical phenomena (e.g., Navier-Stokes, Darcy, etc.) can be specified with appropriate "connections" (e.g., cell-to-cell boundary conditions, etc.) such that a result of the fluid flow simulation is feasible and/or more accurate than without such one or more directional property representations. As mentioned, a tensor approach may be utilized for one or more directional properties, which may make a simulator more stable for a given reservoir being simulated and/or make results of the simulator more accurate and/or make the simulator run in lesser time and/or with lesser computational resources (e.g., less processor power, less memory, etc.). As an example, a simulation run may be lengthy, depending on the number of equations (e.g., as may be associated with grid size, etc.). As an example, a simulation run may be of the order of hours or, for example, days. As may be appreciated, computer resources tied up for hours executing a simulation run may, where stability is lacking, not generate a result or not generate a meaningful result.

A lower run turnaround time can increase benefits from a reservoir study allotted a budgeted time period. As a corollary, time spent in repeated runs fighting model instabilities or time-stepping can be counterproductive. Various factors can affect run time, for example, run time can equal the product (CPU time/step)×(number of timesteps). The first factor tends to be large and the second factor tends to be small for an implicit formulation, and conversely for the IMPES formulation. IMPES is a conditionally stable formulation that involves a timestep $\Delta t < \Delta t^*$ to reduce risk of oscillations and error growth, where $\Delta t^*$ can be defined as a maximum stable timestep. For IMPES, the conditional stability stems from the explicit treatment of nonpressure variables in interblock flow terms.

A simulator may utilize a preconditioner, for example, consider Nested Factorization (NF) and incomplete LU factorization [ILU(n)]. The term "LU factorization" refers to the factoring of a matrix A into the product of a lower triangular matrix L and an upper triangular matrix U, which can be computationally expensive and involve Gaussian elimination. The term "ILU(n)" denotes incomplete LU factorization, where limited fill-in is allowed and n is the order of fill.

NF can perform suitably under particular conditions such as when transmissibilities associated with a particular direction in a grid dominate those in other directions uniformly throughout the grid. ILU(n) or red-black ILU(n) tend to be less sensitive than NF to ordering of blocks and spatial variation of direction of dominant transmissibilities.

Transmissibility can be a measure of conductivity of a formation as to fluid. Transmissibility may be defined by a particular simulator in a particular manner. As an example, transmissibility may be defined with respect to viscosity (e.g., adjusted for viscosity, etc.). Some examples as to transmissibility are mentioned herein. As an example, a simulator may utilize transmissibility when performing simulation runs as to fluid movement in a reservoir and/or equipment (e.g., conduits, etc.) operatively coupled to the reservoir (e.g., via fluid communication, etc.).

The INTERSECT simulator uses a computational solver that can implement preconditioning where such preconditioning can involve algebraically decomposing a system of equations into subsystems that may be handled based on their particular characteristics to facilitate solution. Resulting reservoir equations can be solved numerically by iterative techniques until convergence is reached for the entire system of equations, which can account for one or more wells, one or more surface facilities, etc.

The INTERSECT simulator framework can provide for field tasks as to field operations, which may include operations as to surface facilities. As to an example of a workflow, consider a simulation that accounts for over 100 producing well and includes millions of cells in an unstructured grid, which can structurally model more than 10,000 fractures. As an example, time during execution of a run can include tasks such as evaluate residual and assemble Jacobian matrix, linear solver, nonlinear update and nonlinear convergence test. In such an example, time may be predominantly spent on the linear solver, followed by the evaluation of residual and assembly of the Jacobian matrix.

Figure 12:
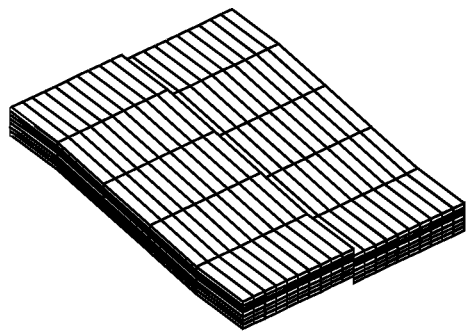
FIG. 12 illustrates an example of a method.
Figure 12:
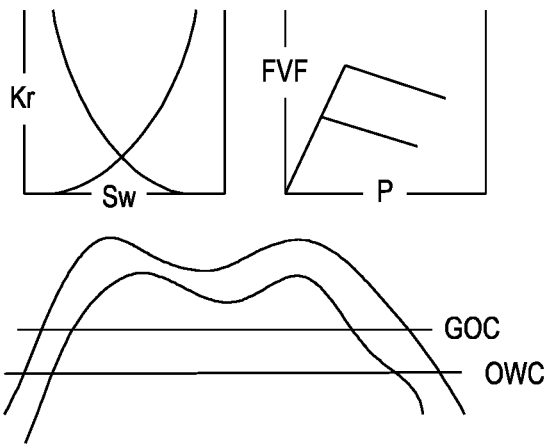
Figure 12:
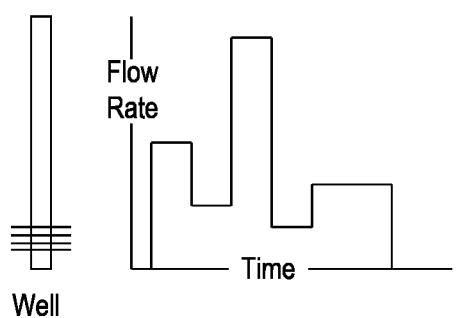

FIG. 12 shows an example of a method 1210 that includes a calculation block 1220 for calculating pore volumes, transmissibilities, depths and NNCs, an initialization and calculation block 1240 for initializing and calculating initial saturations, pressure and fluids in place, and a definition and time progression block 1260 for defining one or more wells and surface facilities and advancing through time, for example, via material balances for individual cells (e.g., with the one or more wells as individual sinks and/or sources). In such an example, the block 1220 may include one or more sets of instructions for generating, adjusting, etc. one or more grids, which may represent one or more faults, a portion of a fault, etc.

As an example, a method can include operating a reservoir simulator to generate simulation results and determining a well trajectory using the generated simulation results and/or constructing a well via drilling into a reservoir using the generated simulation results. As explained, a method can improve reservoir simulator operation to generate more accurate simulation results that improve one or more field operations associated with production of fluid from a reservoir. Such a method improves operation of a reservoir simulator that performs a technological process in the realm of physical objects and physical substances such as a reservoir being a physical object and fluid being a physical substance. As an example, a workflow can include seismic imaging to generate seismic images, identifying structures associated with a reservoir using the seismic images, generating a model that includes the reservoir, assigning directional properties to the model, operating a reservoir simulator to generate fluid flow patterns using the model and the directional properties, drilling a borehole according to a trajectory determined using the fluid flow patterns, completing a well using the borehole, and producing fluid from the reservoir using the well. As an example, drilling a borehole according to a trajectory determined using the fluid flow patterns may also include using directional permeabilities. For example, directional permeabilities may provide an indication of formation properties associated with stability of a borehole in a formation. As an example, an angle of a borehole may be determined using directional permeabilities as the angle may provide for increases stability while maintaining the borehole in a desired reservoir region where a completed well can include perforations that may be directional where direction is based at least in part on directional permeability. As an example, a hydraulic fracturing workflow can include well placement and/or fracture placement based at least in part on directional permeabilities, as may be taken into account by fluid flow simulation results and/or as may be taken into account by hydraulic fracturing simulation results (e.g., by a hydraulic fracturing simulator). In such an example, fractures may be generated using an equipment configuration that aims to generate fractures that provide for favorable drainage of fluid from a reservoir (e.g., fracture orientation with respect to directional permeability). As an example, fractures tend to grow in a particular orientation with respect to a permeability tensor orientation. As an example, a reservoir simulator may simulate a hydraulically fractured reservoir using directional permeabilities that account for one or more hydraulic fractures.

As an example, a method can include utilizing permeability where permeability defines an ability to allow flow to occur at one or more points. As an example, a method can include utilizing transmissibility where transmissibility defines an ability to allow flow between points. As an example, transmissibility can be defined as a measure of conductivity of rock (e.g., reservoir rock, etc.) as may be adjusted by viscosity of flowable fluid (e.g., reservoir fluid, injected fluid, etc.). As an example, a simulator can include computing transmissibility between various cell centers of cells defined by a grid. As mentioned, transmissibility (T) calculations can utilize permeability such as in the form of the permeability tensor K (see, e.g., Equations (9), (10) and (11)). As mentioned, for an unstructured depogrid, an implementation can choose to apply the full tensor K' of Equation (11), which may be different for different cells of the unstructured depogrid.

As to the initialization and calculation block 1240, for an initial time (e.g., t0), saturation distribution within a grid model of a geologic environment and pressure distribution within the grid model of the geologic environment may be set to represent an equilibrium state (e.g., a static state or "no-flow" state), for example, with respect to gravity. As an example, to approximate the equilibrium state, calculations can be performed. As an example, such calculations may be performed by one or more sets of instructions. For example, one or more of a seismic-to-simulation framework, a reservoir simulator, a specialized set of instructions, etc. may be implemented to perform one or more calculations that may aim to approximate or to facilitate approximation of an equilibrium state. As an example, a reservoir simulator may include a set of instructions for initialization using data to compute capillary and fluid gradients, and hence fluid saturation densities in individual cells of a grid model that represents a geologic environment.

As an example, a reservoir simulator may advance in time. As an example, a numeric solver may be implemented that can generate a solution for individual time increments (e.g., points in time). As an example, a solver may implement an implicit solution scheme and/or an explicit solution scheme, noting that an implicit solution scheme may allow for larger time increments than an explicit scheme. Times at which a solution is desired may be set forth in a "schedule". For example, a schedule may include smaller time increments for an earlier period of time followed by larger time increments.

A solver may implement one or more techniques to help assure stability, convergence, accuracy, etc. For example, when advancing a solution in time, a solver may implement sub-increments of time, however, an increase in the number of increments can increase computation time. As an example, an adjustable increment size may be used, for example, based on information of one or more previous increments.

As an example, a numeric solver may implement one or more of a finite difference approach, a finite element approach, a finite volume approach, etc. As an example, the ECLIPSE reservoir simulator can implement central differences for spatial approximation and forward differences in time. As an example, a matrix that represents grid cells and associated equations may be sparse, diagonally banded and blocked as well as include off-diagonal entries. As an example, the INTERSECT simulator may be implemented.

As an example, a solver may implement an implicit pressure, explicit saturation (IMPES) scheme. Such a scheme may be considered to be an intermediate form of explicit and implicit techniques. In an IMPES scheme, saturations are updated explicitly while pressure is solved implicitly.

As to conservation of mass, values (e.g., for water, gas and oil) in individual cells of a grid cell model may be specified to sum to a certain value, which may be considered a control criterion for mass conservation. As black oil equations tend to be non-linear, a Newton-Raphson type of technique may be implemented, which includes determining derivatives, iterations, etc. For example, a solution may be found by iterating according to the Newton-Raphson scheme where such iterations may be referred to as non-linear iterations, Newton iterations or outer iterations. Where one or more error criteria are fulfilled, the solution procedure has converged, and a converged solution has been found. Thus, within a Newton iteration, a linear problem is solved by performing a number of linear iterations, which may be referred to as inner iterations.

As an example, a solution scheme may be represented by the following pseudo-algorithm:

```
// Pseudo-algorithm for Newton-Raphson for systems
initialize(v);
do {
    //Non-linear iterations
    formulate_non_linear_system(v);
    make_total_differential(v);
    do {
        // Linear iterations:
        update_linear_system_variables(v);
    }
    while((linear_system_has_not_converged(v));
    update_non_linear_system_after_linear_convergence(v);
}
while((non_linear_system_has_not_converged(v))
```

As an example, a solver may perform a number of inner iterations (e.g., linear) and a number of outer iterations (e.g., non-linear). As an example, a number of inner iterations may be of the order of about 10 to about 20 within an outer iteration while a number of outer iterations may be about ten or less for an individual time increment.

As mentioned, a grid may be revised (e.g., adjusted, etc.) based at least in part on simulation results, which may optionally include results such as convergence behavior. For example, where convergence may be possibly improved, one or more adjustments may be made to a grid where such one or more adjustments may allow for convergence, expedite convergence, etc.

Figure 13:
FIG. 13 illustrates an example of a portion of a geologic environment.

FIG. 13 shows an example of geology 1310 of a geologic environment where various structural features can be observed. One or more of such features may exist in a subterranean environment that can be represented via one or more grids. In the geology 1310, it is exposed at the surface of the Earth, where it is visible to the human eye. Where such structural features exist within the Earth, one or more technologies can be utilized to acquire data representative of the structural features where such data interacts with the structural features. For example, seismic imaging utilizes seismic energy that can reflect off a reflector, which is an interface between layers of contrasting acoustic properties.

In seismic data, a reflector might represent a change in lithology, a fault or an unconformity. A reflector is expressed as a reflection in seismic data. In the geologic 1310, various lines can be seen that represent layers of material and/or interfaces. Various lines are disposed at an angle to the horizon of the foreground. Such an angle may be due to natural processes such as those associated with faulting. For example, materials of layers may be been deposited horizontally by natural processes where other natural processes (e.g., stress, strain, etc.) resulted in displacements such that dipping of the layers. A depositional environment can be an area in which sediments have been deposited, which can include one or more sediment sources. As an example, a depositional process can be via one or more natural processes (deposition by wind, water or ice; location and climate, such as desert, swamp or river; deposition by volcanic activity; etc.). A depositional environment can include properties that are at least in part dictated by depositional energy (e.g., past, present, past and present, etc.). Deposition energy pertains to relative kinetic energy of an environment. A high-energy environment might include a rapidly flowing stream that is capable of carrying coarse-grained sediments, such as gravel and sand. Sedimentation in a low-energy environment, such as an abyssal plain, can involve very fine-grained clay or mud. As an example, a glacier can be capable of carrying large boulders.

Directional permeability of rock may be characterized by rock with a higher permeability along a given plane, which may be created by natural fracture development, water flow that leaches the pores, depositional environment or localized reworking of the sediments.

As an example, a method can include accessing a depogrid generated via gridding of a structural model in a depositional space and transforming the gridded structural model to a geological space via an inverse mapping where the structural model represents structural features in a subterranean environment based at least in part on data acquired via at least one sensor; determining local u, v and w axes for a plurality of cells in the depogrid via volumetric centroids and vertices represented by coordinates in a depositional space coordinate system (u, v, w) and by coordinates in a physical coordinate system (x, y, z); defining directional geological grid properties based at least in part on the local u, v and w axes; and simulating physical phenomena of the subterranean environment via a simulator based at least in part on at least a portion of the directional geological grid properties. In such an example, the accessing can be via one or more networks, which can include one or more network interfaces, pieces of network equipment, etc. In such an example, the simulator is a machine, which may be distributed. A simulator includes one or more processors, memory accessible to at least one of the processors and one or more interfaces that can transmit and/or receive data. As an example, a simulator may be operatively coupled to one or more controllers, which may be distributed and part of a control system that includes various components that can issue control instructions to one or more pieces of equipment.

As an example, a method can include determining grid attributes utilizing the local u, v and w axes. In such an example, the method may include performing a quality assessment based at least in part on the grid attributes. In such an example, the quality assessment may be of data and/or a depogrid.

As an example, directional geological grid properties can include a permeability property. In such an example, the permeability property can be a tensor permeability property.

As an example, a method can include, during simulating, calculating cell-to-cell transmissibility. Such calculating can be based at least in part on directional geological grid properties. In such an example, directions associated with such properties may be local and made to be more accurate via one or more techniques. Such an approach can improve the simulator in that it can perform simulations in less time, more accurately, etc. As mentioned, convergence of a simulation can depend on how accurately a physical environment is represented by a grid that includes cells and properties associated with such cells. Where the grid and/or properties represent physical reality more accurately, equations that account for physical phenomena can be more likely solvable to provide one or more simulation result that is more accurate and/or more physically meaningful. A balance may be made between grid density (e.g., number of unknowns), grid regularity (e.g., cuboid-like or regular structures), computational components of a simulator (e.g., simulator hardware), and desired reliability of one or more simulation results. For example, with a more accurate representation of physical properties, a grid density may be reduced such that a "problem" is smaller. Or, for example, with more accurate representation of physical properties, a "problem" may be solved without reduction in grid density. As an example, more accurate representation of physical properties can improve convergence, which is an operational characteristic of a simulator with respect to a problem (e.g., physical phenomena to be simulated).

As an example, a depogrid can be or include an unstructured grid.

As an example, determining local u, v and w axes can include determining variations of coordinates in the depositional space coordinate system (u, v, w) and coordinates in the physical coordinate system (x, y, z) within each of a plurality of cells of the depogrid.

As an example, a simulator can include at least one processor, memory accessibly by the processor, processor-executable instructions stored in the memory and at least one data interface.

As an example, a depogrid can include tetrahedral cells. As an example, such cells may be subject to various constraints as to shape and/or size, which may be relative to one or more other cells in a depogrid. As an example, cells with aspect ratios that do not meet certain criteria may be regrided or otherwise subject to adjustment. As an example, an unstructured grid may be characterized by its cuboidness (e.g., internal angles, aspect ratios, etc.).

As an example, a depogrid can match a structural model. As an example, a depogrid can have a regular discretization in a depositional space.

As an example, a method can include utilizing mapping and determined local u, v and w axes to analyze quality of a depogrid.

As an example, a method can include issuing a control instruction to at least one piece of equipment operatively coupled to a subterranean environment based at least in part on at least one result of simulating by a simulator.

As an example, a system can include a processor; memory operatively coupled to the processor; and processor-executable instructions stored in the memory to instruct the system, the instructions including instructions to: access a depogrid generated via gridding of a structural model in a depositional space and transforming the gridded structural model to a geological space via an inverse mapping where the structural model represents a subterranean environment; determine local u, v and w axes for a plurality of cells in the depogrid via volumetric centroids and vertices represented by coordinates in a depositional space coordinate system (u, v, w) and by coordinates in a physical coordinate system (x, y, z); define directional geological grid properties based at least in part on the local u, v and w axes; and simulate physical phenomena of the subterranean environment via a simulator based at least in part on at least a portion of the directional geological grid properties. In such an example, the structural model can include at least one structural feature represented by data acquired by at least one sensor. As an example, at least one sensor can be a seismic energy sensor (e.g., land-based, downhole, marine-based, etc.).

As an example, a structural feature can be a horizon. As an example, a structural feature can be a fault.

As an example, one or more computer-readable storage media can include computer-executable instructions to instruct a computer, the instructions including instructions to: access a depogrid generated via gridding of a structural model in a depositional space and transforming the gridded structural model to a geological space via an inverse mapping where the structural model represents a subterranean environment; determine local u, v and w axes for a plurality of cells in the depogrid via volumetric centroids and vertices represented by coordinates in a depositional space coordinate system (u, v, w) and by coordinates in a physical coordinate system (x, y, z); define directional geological grid properties based at least in part on the local u, v and w axes; and simulate physical phenomena of the subterranean environment via a simulator based at least in part on at least a portion of the directional geological grid properties.

As an example, one or more of the example method can include or be associated with various computer-readable media (CRM) blocks. Such blocks generally include instructions suitable for execution by one or more processors (or processor cores) to instruct a computing device or system to perform one or more actions. While various blocks are shown, a single medium may be configured with instructions to allow for, at least in part, performance of various actions of one or more methods. As an example, a computer-readable medium (CRM) may be a computer-readable storage medium that is non-transitory and that is not a carrier wave.

As an example, a workflow may be associated with various computer-readable media (CRM) blocks. Such blocks generally include instructions suitable for execution by one or more processors (or cores) to instruct a computing device or system to perform one or more actions. As an example, a single medium may be configured with instructions to allow for, at least in part, performance of various actions of a workflow. As an example, a computer-readable medium (CRM) may be a computer-readable storage medium. As an example, blocks may be provided as one or more sets of instructions, for example, such as the one or more sets of instructions 270 of the system 250 of FIG. 2, etc.

Figure 14:
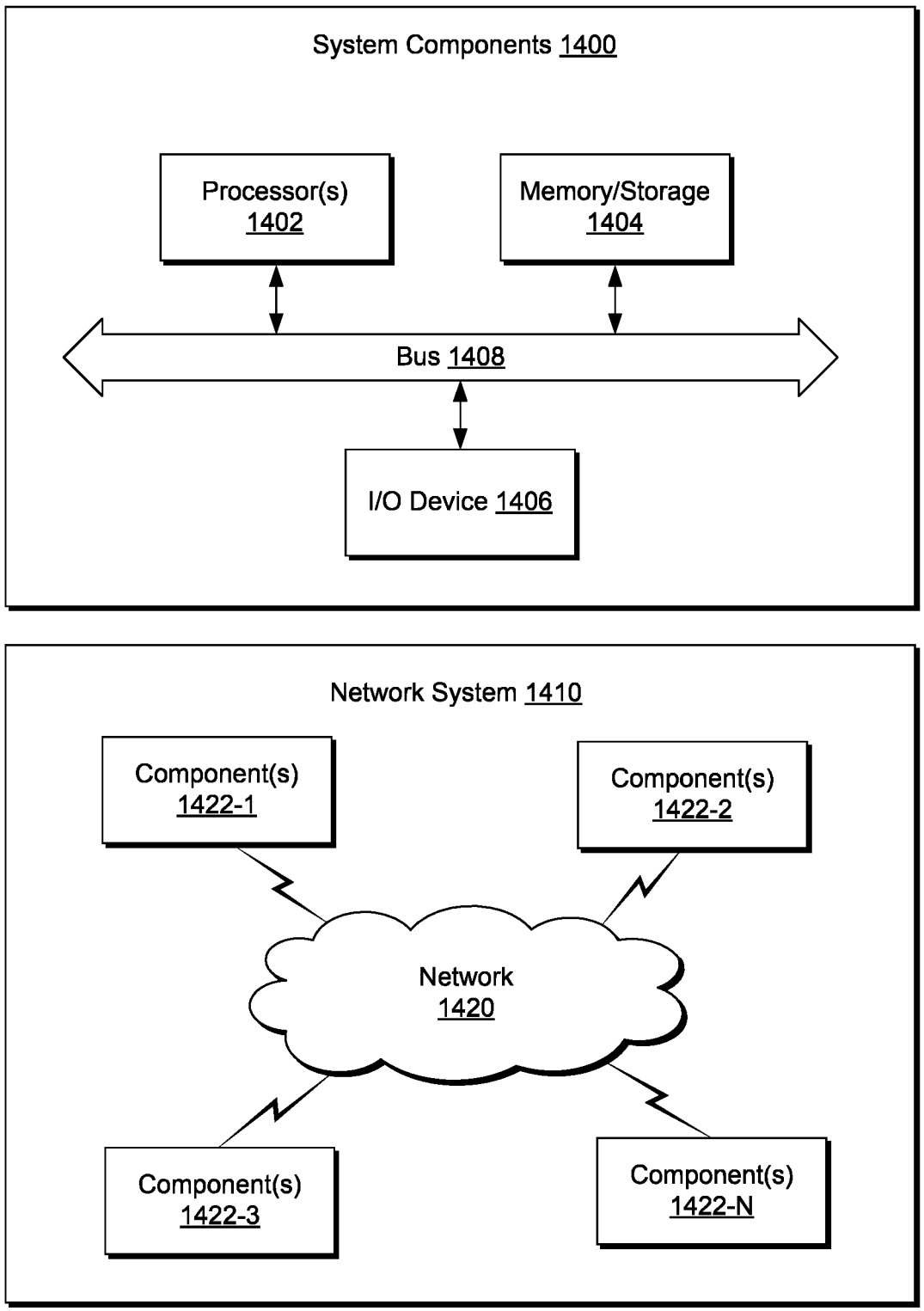
FIG. 14 illustrates example components of a system and a networked system.

FIG. 14 shows components of an example of a computing system 1400 and an example of a networked system 1410. The system 1400 includes one or more processors 1402, memory and/or storage components 1404, one or more input and/or output devices 1406 and a bus 1408. In an example embodiment, instructions may be stored in one or more computer-readable media (e.g., memory/storage components 1404). Such instructions may be read by one or more processors (e.g., the processor(s) 1402) via a communication bus (e.g., the bus 1408), which may be wired or wireless. The one or more processors may execute such instructions to implement (wholly or in part) one or more attributes (e.g., as part of a method). A user may view output from and interact with a process via an I/O device (e.g., the device 1406). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1410. The network system 1410 includes components 1422-1, 1422-2, 1422-3, . . . 1422-N. For example, the components 1422-1 may include the processor(s) 1402 while the component(s) 1422-3 may include memory accessible by the processor(s) 1402. Further, the component(s) 1402-2 may include an I/O device for display and optionally interaction with a method. The network 1420 may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

BIBLIOGRAPHY (DOCUMENTS INCORPORATED BY REFERENCE HEREIN)

Aavatsmark, I. (2002). An introduction to multipoint flux approximations for quadrilateral grids. Computational Geosciences, 6, 405-432.

Aavatsmark, I. (2007). Interpretation of a two-point flux stencil for skew parallelogram grids. Computational Geosciences, 11(3), 199-206. ISSN 1420-0597, 1573-1499. doi: 10.1007/s10596-007-9042-1.

Benabbou, A., Daly, C., Mace, L., Levannier, A. and Buchholz, C. (2015). An unstructured depositional grid for property modeling. In Petroleum Geostatistics, Biarritz, France, 7-11 Sep. 2015.

Edwards, M. and Rogers, C. (1998). Finite volume discretization with imposed flux continuity for the general tensor pressure equation. Computational Geosciences, 2(4), 259-290.

Ponting, D. K. (1989). Corner point geometry in reservoir simulation. In Proceedings of Joint IMA/SPE European Conference on the Mathematics of Oil Recovery, Cambridge, UK, 25-27 July, pp. 45-65. Clarendon Press, Oxford.

What is claimed is:

1. A method comprising:
accessing a depogrid generated via gridding of a structural model in a depositional space and transforming the gridded structural model to a geological space via an inverse mapping wherein the structural model represents structural features in a subterranean environment based at least in part on data acquired via at least one sensor;
determining local u, v and w axes for a plurality of cells in the depogrid via volumetric centroids and vertices of each of the plurality of cells as represented by coordinates in a depositional space coordinate system (u, v, w) and by coordinates in a physical coordinate system (x, y, z);
orthonormalizing the local u, v and w axes for the plurality of cells to generate orthonormalized local u, v and w axes for the plurality of cells, wherein an increased local amount of orthonormalization indicates a decreased local quality due to locally inconsistent interpretation of one or more of the structural features represented in the structural model;
defining directional geological grid properties based at least in part on the orthonormalized local u, v and w axes, wherein the directional geological grid properties comprise a tensor permeability property; and
simulating fluid dynamics of the subterranean environment to generate simulation results via a simulator based at least in part on at least a portion of the directional geological grid properties as assigned to the depogrid.

2. The method of claim 1 wherein the orthonormalizing comprises determining grid attributes utilizing the local u, v and w axes.

3. The method of claim 2 comprising performing a quality assessment based at least in part on the grid attributes.

4. The method of claim 1 comprising, during the simulating, calculating cell-to-cell transmissibility.

5. The method of claim 1 wherein the depogrid comprises an unstructured grid.

6. The method of claim 1 wherein the determining local u, v and w axes comprises determining variations of coordinates in the depositional space coordinate system (u, v, w) and coordinates in the physical coordinate system (x, y, z) within each of a plurality of cells of the depogrid.

7. The method of claim 1 wherein the simulator comprises at least one processor, memory accessibly by the processor, processor-executable instructions stored in the memory and at least one data interface.

8. The method of claim 1 wherein the depogrid comprises tetrahedral cells.

9. The method of claim 1 wherein the depogrid matches the structural model.

10. The method of claim 1 wherein the depogrid comprises a regular discretization in the depositional space.

11. The method of claim 1 comprising issuing a control instruction to at least one piece of equipment operatively coupled to the subterranean environment based at least in part on the simulation results.

12. The method of claim 1, responsive to an increased local amount of orthonormalization that indicates a decreased local quality due to locally inconsistent interpretation of one or more of the structural features represented in the structural model, re-interpreting at least one of the one or more of the structural features to generate a revised structural model.

13. The method of claim 12 comprising revising the depogrid using the revised structural model.

14. The method of claim 1 wherein the simulating fluid dynamics depends on the tensor permeability property and wherein the tensor permeability property represents, in each of the plurality of cells, a lateral permeability relative to the orthonormalized local u and v axes and a through-layer permeability relative to the orthonormalized local w axis.

15. The method of claim 14 wherein the lateral permeability and the orthogonal through-layer permeability of the tensor permeability property improve the simulating and accuracy of the simulation results.

16. A system comprising:
a processor;
memory operatively coupled to the processor; and
processor-executable instructions stored in the memory to instruct the system, the instructions comprising instructions to:
access a depogrid generated via gridding of a structural model in a depositional space and transforming the gridded structural model to a geological space via an inverse mapping wherein the structural model represents structural features in a subterranean environment based at least in part on data acquired via at least one sensor;
determine local u, v and w axes for a plurality of cells in the depogrid via volumetric centroids and vertices of each of the plurality of cells as represented by coordinates in a depositional space coordinate system (u, v, w) and by coordinates in a physical coordinate system (x, y, z);
orthonormalize the local u, v and w axes for the plurality of cells to generate orthonormalized local u, v and w axes for the plurality of cells, wherein an increased local amount of orthonormalization indicates a decreased local quality due to locally inconsistent interpretation of one or more of the structural features represented in the structural model;

define directional geological grid properties based at least in part on the orthonormalized local u, v and w axes, wherein the directional geological grid properties comprise a tensor permeability property; and simulate fluid dynamics of the subterranean environment to generate simulation results via a simulator based at least in part on at least a portion of the directional geological grid properties as assigned to the depogrid.

17. The system of claim 16 wherein the at least one sensor comprises a seismic energy sensor.

18. The system of claim 16 wherein the structural features comprise at least one horizon.

19. The system of claim 16 wherein the structural features comprise at least one fault.

20. One or more computer-readable storage media comprising computer-executable instructions to instruct a computer, the instructions comprising instructions to:

access a depogrid generated via gridding of a structural model in a depositional space and transforming the gridded structural model to a geological space via an inverse mapping wherein the structural model represents structural features in a subterranean environment based at least in part on data acquired via at least one sensor;

determine local u, v and w axes for a plurality of cells in the depogrid via volumetric centroids and vertices of each of the plurality of cells as represented by coordinates in a depositional space coordinate system (u, v, w) and by coordinates in a physical coordinate system (x, y, z);

orthonormalize the local u, v and w axes for the plurality of cells to generate orthonormalized local u, v and w axes for the plurality of cells, wherein an increased local amount of orthonormalization indicates a decreased local quality due to locally inconsistent interpretation of one or more of the structural features represented in the structural model;

define directional geological grid properties based at least in part on the orthonormalized local u, v and w axes, wherein the directional geological grid properties comprise a tensor permeability property; and simulate fluid dynamics of the subterranean environment via a simulator to generate simulation results based at least in part on at least a portion of the directional geological grid properties as assigned to the depogrid.

\* \* \* \* \*